US012764919B2

(12) United States Patent
Lu

(10) Patent No.: US 12,764,919 B2
(45) **Date of Patent: *Oct. 13, 2026**

(54) HOMOGENEOUS/ HETEROGENEOUS INTEGRATION SYSTEM WITH HIGH PERFORMANCE COMPUTING AND HIGH STORAGE VOLUME

(71) Applicant: Invention And Collaboration Laboratory Pte. Ltd., Singapore (SG)

(72) Inventor: Chao-Chun Lu, Hsinchu (TW)

(73) Assignee: INVENTION AND COLLABORATION LABORATORY PTE. LTD., Singapore (SG)

( * ) Notice: Subject to any disclaimer, the term of this patent is extended or adjusted under 35 U.S.C. 154(b) by 636 days.

This patent is subject to a terminal disclaimer.

(21) Appl. No.: 18/082,013

(22) Filed: Dec. 15, 2022

(65) Prior Publication Data

US 2023/0200040 A1 Jun. 22, 2023

Related U.S. Application Data

(60) Provisional application No. 63/290,076, filed on Dec. 16, 2021.

(51) Int. Cl.
*G11C 11/417* (2006.01)
*G11C 11/412* (2006.01)
(Continued)

(52) U.S. Cl.
CPC ............ *H10B 10/12* (2023.02); *G11C 11/412* (2013.01); *G11C 11/417* (2013.01); *H10W 90/00* (2026.01)

(58) Field of Classification Search
CPC ...... H10B 10/12; H10B 10/18; G11C 11/412; G11C 11/417; H01L 23/485;
(Continued)

(56) References Cited

U.S. PATENT DOCUMENTS

| | | | | |
|---|---|---|---|---|
| 5,930,642 A * | 7/1999 | Moore | .................. | H10P 30/209 257/E29.295 |
| 11,488,935 B1 * | 11/2022 | Zaman | ................ | G06F 13/4022 |

(Continued)

FOREIGN PATENT DOCUMENTS

| | | |
|---|---|---|
| CN | 110192269 A | 8/2019 |
| JP | 2005244247 A * | 9/2005 |

(Continued)

OTHER PUBLICATIONS

Extended European Search Report for corresponding European Application No. 22214179.8, dated Jul. 4, 2023.

(Continued)

*Primary Examiner* — Amir Zarabian
*Assistant Examiner* — Justin Bryce Heisterkamp
(74) *Attorney, Agent, or Firm* — Birch, Stewart, Kolasch & Birch, LLP

(57) ABSTRACT

An integration system includes a first monolithic die and a second monolithic die. The first monolithic die has a processing unit circuit formed therein; and the second monolithic die has a plurality of SRAM arrays formed therein. Wherein the second monolithic die comprises at least 2G Bytes; and the first monolithic die is electrically connected to the second monolithic die.

15 Claims, 26 Drawing Sheets

(51) Int. Cl.
*H10B 10/00* (2023.01)
*H10W 90/00* (2026.01)

(58) Field of Classification Search
CPC ... H01L 23/5226; H01L 25/18; H01L 25/065; H01L 2225/06506
See application file for complete search history.

(56) References Cited

U.S. PATENT DOCUMENTS

| | | | | |
|---|---|---|---|---|
| 11,836,102 | B1* | 12/2023 | Mathuriya | G06F 13/4027 |
| 2006/0131657 | A1* | 6/2006 | Hamaguchi | H10D 62/151 257/296 |
| 2013/0171777 | A1 | 7/2013 | Grobelny et al. | |
| 2013/0174873 | A1* | 7/2013 | Yoshihara | H05K 3/26 134/21 |
| 2014/0328104 | A1* | 11/2014 | Jeon | G11C 5/025 365/63 |
| 2018/0366329 | A1* | 12/2018 | Kim | H10D 64/01334 |
| 2020/0066651 | A1 | 2/2020 | Burton et al. | |
| 2021/0043557 | A1* | 2/2021 | Lee | H10W 20/023 |
| 2021/0074709 | A1* | 3/2021 | Liu | H10B 10/12 |
| 2021/0165316 | A1* | 6/2021 | Lee | G03F 1/52 |
| 2021/0225446 | A1 | 7/2021 | Bhattacharyya | |
| 2021/0247910 | A1 | 8/2021 | Kim et al. | |
| 2021/0375849 | A1* | 12/2021 | Gomes | H10W 90/00 |
| 2021/0407901 | A1* | 12/2021 | Akarvardar | H10P 76/2041 |
| 2022/0020747 | A1* | 1/2022 | Liao | H10D 64/689 |
| 2022/0077127 | A1* | 3/2022 | Park | H10W 20/023 |
| 2022/0293170 | A1* | 9/2022 | Lu | G11C 11/417 |
| 2022/0302129 | A1* | 9/2022 | Lu | G11C 11/412 |
| 2022/0367435 | A1* | 11/2022 | Hung | H10W 90/00 |
| 2023/0108072 | A1* | 4/2023 | Then | H10D 30/475 257/76 |
| 2023/0200040 | A1* | 6/2023 | Lu | H10B 10/12 326/41 |
| 2023/0240087 | A1* | 7/2023 | Lu | H10B 80/00 |

FOREIGN PATENT DOCUMENTS

| | | | |
|---|---|---|---|
| JP | 2015-73107 | A | 4/2015 |
| JP | 2016-530704 | A | 9/2016 |
| JP | 2019-47006 | A | 3/2019 |
| KR | 10-2021-0009126 | A | 1/2021 |
| WO | WO 2019/079625 | A1 | 4/2019 |
| WO | WO 2021/242227 | A1 | 12/2021 |

OTHER PUBLICATIONS

Japanese Office Action for Japanese Application No. 2022-201384, dated Jun. 18, 2024, with English translation.

Korean Office Action for Korean Application No. 10-2022-0177402, dated Jun. 19, 2024, with English translation.

* cited by examiner

| | | | | | | | | |
|---|---|---|---|---|---|---|---|---|
| Technology (F or Lamda) | 28 | 22 | 20 | 16 | 14 | 10 | 7 | 5 |
| SRAM Cell Area in um2 | 0.127 | 0.092 | 0.081 | 0.07 | 0.05 | 0.042 | 0.027 | 0.021 |
| SRAM Cell Area in F2 | 174 | 190 | 203 | 273 | 255 | 420 | 551 | 840 |

HOMOGENEOUS/ HETEROGENEOUS INTEGRATION SYSTEM WITH HIGH PERFORMANCE COMPUTING AND HIGH STORAGE VOLUME

This application claims the benefit of U.S. provisional applications Ser. No. 63/290,076 filed Dec. 16, 2021, the subject matter of which is incorporated herein by reference.

BACKGROUND OF THE DISCLOSURE

Field of the Disclosure

The disclosure relates in general to a semiconductor structure, and more particularly to an integration system including a logic chip with high performance computing and a SRAM chip with large storage volume.

Description of the Related Art

Information technology (IT) systems are rapidly evolving in businesses and enterprises across the board, including those in factories, healthcare, and transportation. Nowadays, system on chip (SOC) or artificial intelligence (AI) is the keystone of IT systems which is making factories smarter, improving patient outcomes better, increasing autonomous vehicle safety. Data from manufacturing equipment, sensors, machine vision systems could be easily total 1 petabyte per day. Therefore, a high performance computing (HPC) SOC or AI chip is required to handle the such petabyte data.

Generally speaking, AI chips could be categorized by a graphic processing unit (GPU), a field programmable gate array (FPGA), and an application specific IC (ASIC). Originally designed to handle graphical processing applications using parallel computing, GPUs began to be used more and more often for AI training. GPU's training speed and efficiency generally is 10 to 1000 times larger than general purpose CPU.

FPGAs have blocks of logic that interact with each other and can be designed by engineers to help specific algorithms, and is suitable for AI inference. Due to faster time to market, lower cost, and flexibility, FPGA prefers over ASIC design although it has disadvantages like larger size, slower speed, and larger power consumption. Due to the flexibility of FPGA, it is possible to partially program any portion of the FPGA depending on the requirement. FPGA's inference speed and efficiency is 10-100 times larger than general purpose CPU.

On the other hand, ASICs are tailored directly to the circuitry and are generally more efficient than FPGAs. For customized ASIC, its training/inference speed and efficiency could be 10-1000 times larger than general purpose CPU. However, unlike FPGAs which are easier to customize as AI algorithms continue to evolve, ASICs are slowly becoming obsolete as new AI algorithms are developed.

No matter in GPU, FPGA, and ASICs (or other similar SOC, CPU, NPU, etc.), logic circuit and SRAM circuit are two major circuit the combination of which approximately occupy around 90% of the AI chip size. The rest 10% of the AI chip may include I/O pads circuit. Nevertheless, the scaling process/technology nodes for manufacturing AI chips are becoming increasingly necessary to train an AI machine efficiently and quickly because they offer better efficiency and performance. Improvement in integrated circuit performance and cost has been achieved largely by process scaling technology according to Moore's Law, but such scaling technology down to 3 nm to 5 nm encounter a lot of technical difficulties, so the semiconductor industry's investment costs in R&D and capital are dramatically increasing.

For example, SRAM device scaling for increased storage density, reduction in operating voltage (VDD) for lower stand-by power consumption, and enhanced yield necessary to realize larger-capacity SRAM become increasingly difficult to achieve, with miniaturization down to the 28 nm (or lower) manufacture process is a challenge.

FIG. 1 shows the SRAM cell architecture, that is the six-transistor (6-T) SRAM cell. It consists of two cross-coupled inverters (PMOS pull-up transistors PU-1 and PU-2 and NMOS pull-down transistors PD-1 and PD-2) and two access transistors (NMOS pass-gate transistors PG-1 and PG-2). The high level voltage VDD is coupled to the PMOS pull-up transistors PU-1 and PU-2, and the low level voltage VSS are coupled to the NMOS pull-down transistors PD-1 and PD-2. When the word-line (WL) is enabled (i.e., a row is selected in an array), the access transistors are turned on, and connect the storage nodes (Node-1/Node-2) to the vertically-running bit-lines (BL and BL Bar).

FIG. 2 shows the "stick diagram" representing the layout and connection among the 6 transistors of the SRAM. The stick diagram usually just includes active regions (vertical bars) and gate lines (horizontal bars) to form the pull-down transistors PD and the pull-up transistors PU of the 6 transistors of the SRAM. Of course, there are still lots of contacts, on one hand directly coupled to the 6 transistors, and on the other hand, coupled to the word-line (WL), bit-lines (BL and BL Bar), high level voltage VDD, and low level voltage VSS, etc.

Some of the reasons for the dramatically increase of the total area of the SRAM cell represented by $\lambda^2$ or $F^2$ when the minimum feature size decreases could be described as follows. The traditional 6T SRAM has six transistors which are connected by using multiple interconnections, has its first interconnection layer M1 to connect the gate-level ("Gate") and the diffusion-level of the Source-region and the Drain-region (those regions called generally as "Diffusion") of the transistors. There is a need to increase a second interconnection layer M2 and/or a third interconnection layer M3 for facilitating signal transmission (such as the word-line (WL) and/or bit-lines (BL and BL Bar)) without enlarging the die size by only using M1, then a structure Via-1, which is composed of some types of the conductive materials, is formed for connecting M2 to M1.

Thus, there is a vertical structure which is formed from the Diffusion through a Contact (Con) connection to M1, i.e. "Diffusion-Con-M1". Similarly, another structure to connect the Gate through a Contact structure to M1 can be formed as "Gate-Con-M1". Additionally, if a connection structure is needed to be formed from an M1 interconnection through a Via1 to connect to an M2 interconnection, then it is named as "M1-Via1-M2". A more complex interconnection structure from the Gate-level to the M2 interconnection can be described as "Gate-Con-M1-Via1-M2". Furthermore, a stacked interconnection system may have an "M1-Via1-M2-Via2-M3" or "M1-Via1-M2-Via2-M3-Via3-M4" structure, etc.

Since the Gate and the Diffusion in two access transistors (NMOS pass-gate transistors PG-1 and PG-2, as shown in FIG. 1) shall be connected to the word-line (WL) and/or bit-lines (BL and BL Bar) which will be arranged in the second interconnection layer M2 or the third interconnection layer M3, in traditional SRAM such metal connections must go through interconnection layer M1 first. That is, the state-of-the-art interconnection system in SRAM may not allow the Gate or Diffusion directly connect to M2 without bypassing the M1 structure.

As results, the necessary space between one M1 interconnection and the other M1 interconnection will increase the die size and in some cases the wiring connections may block some efficient channeling intention of using M2 directly to surpass M1 regions. In addition, it is difficult to form a self-alignment structure between Via1 to Contact and at the same time both Via1 and Contact are connected to their own interconnection systems, respectively.

Additionally, in traditional 6T SRAM, at least there are one NMOS transistor and one PMOS transistor located respectively inside some adjacent regions of p-substrate and n-well which have been formed next to each other within a close neighborhood, a parasitic junction structure called n+/p/n/p+ parasitic bipolar device is formed with its contour starting from the n+ region of the NMOS transistor to the p-well to the neighboring n-well and further up to the p+ region of the PMOS transistor.

There are significant noises occurred on either n+/p junctions or p+/n junctions, an extraordinarily large current may flow through this n+/p/n/p+ junction abnormally which can possibly shut down some operations of CMOS circuits and to cause malfunction of the entire chip. Such an abnormal phenomenon called Latch-up is detrimental for CMOS operations and must be avoided. One way to increase the immunity to Latch-up which is certainly a weakness for CMOS is to increase the distance from n+ region to the p+ region. Thus, the increase of the distance from n+ region to the p+ region to avoid Latch-up issue will also enlarge the size of the SRAM cell.

However, even miniaturization of the manufacture process down to the 28 nm or lower (so called, "minimum feature size", "Lambda (A)", or "F"), due to the interference among the size of the contacts, among layouts of the metal wires connecting the word-line (WL), bit-lines (BL and BL Bar), high level voltage VDD, and low level voltage VSS, etc., the total area of the SRAM cell represented by $\lambda^2$ or $F^2$ dramatically increases when the minimum feature size decreases, as shown in FIG. 3 (cited from J. Chang et al., "15.1 A 5 nm 135 Mb SRAM in EUV and High-Mobility-Channel FinFET Technology with Metal Coupling and Charge-Sharing Write-Assist Circuitry Schemes for High-Density and Low-VMIN Applications," 2020 IEEE International Solid-State Circuits Conference-(ISSCC), 2020, pp. 238-240).

Similar situation happens to logic circuit scaling. Logic circuit scaling for increased storage density, reduction in operating voltage (Vdd) for lower stand-by power consumption, and enhanced yield necessary to realize larger-capacity logic circuit become increasingly difficult to achieve. Standard cells are commonly used and basic elements in logic circuit. The standard cell may comprise basic logical function cells (such as, inverter cell, NOR cell, and NAND cell.

Similarly, even miniaturization of the manufacture process down to the 28 nm or lower, due to the interference among the size of the contacts and layouts of the metal wires, the total area of the standard cell represented by $\lambda^2$ or $F^2$ dramatically increases when the minimum feature size decreases.

FIG. 4(*a*) shows the "stick diagram" representing the layout and connection among PMOS and NMOS transistors of one semiconductor company's 5 nm (UHD) standard cell. The stick diagram just includes active regions (horizontal lines) and gate lines (vertical line). Hereinafter, the active region could be named as "fin". Of course, there are still lots of contacts, on one hand directly coupled to the PMOS and NMOS transistors, and on the other hand, coupled to the input terminal, the output terminal, high level voltage Vdd, and low level voltage VSS (or ground "GND"), etc. Especially, each transistor includes two active regions or fins (marked by grey dash rectangles) to form the channel of the transistor, such that the W/L ratio could be maintained within an acceptable range. The area size of the inverter cell is equal to X×Y, wherein X=2×Cpp, Y=Cell_Height, Cpp is the distance of Contact to Poly Pitch (Cpp).

It is noticed that, some active regions or fins between PMOS and NMOS (called "dummy fins") are not utilized in PMOS/NMOS of this standard cell, the potential reason of which is likely related to the latch-up issue between the PMOS and NMOS. Thus, the latch-up distance between the PMOS and NMOS in FIG. 4(*a*) is 3×Fp, wherein Fp is the fin pitch. Based on the available data regarding Cpp (54 nm) and cell Height (216 nm) in the 5 nm standard cell, the cell area can be calculated by X×Y equal to 23328 $nm^2$ (or 933.12$\lambda^2$, wherein Lambda ($\lambda$) is the minimum feature size as 5 nm). FIG. 4(*b*) illustrates the aforesaid 5 nm standard cell and the dimensions thereof. As shown in FIG. 4(*b*), the latch-up distance between PMOS and NMOS is 15$\lambda$, Cpp is 10.8$\lambda$, and cell Height is 43.2$\lambda$.

The scaling trend regarding area size (2Cpp×Cell_Height) vs. different process technology node for three foundries could be shown in FIG. 5. As the technology node decreases (such as, from 22 nm down to 5 nm), it is clear that the conventional standard cell (2Cpp×Cell_Height) area size in term of $\lambda^2$ increases dramatically. In the conventional standard cell, the smaller the technology process node, the higher the area size in term of $\lambda^2$. Such dramatic increase $\lambda^2$, no matter in SRAM or logic circuit, may be caused by the difficulty to proportionally shrink the size of gate contact/source contact/drain contact as $\lambda$ decreases, the difficulty to proportionally shrink the latch-up distance between the PMOS and NMOS, and the interference in metal layers as A decreases, etc.

From another point of view, any high performance computing (HPC) chip, such as, SOC, AI, NPU (Network Processing Unit), GPU, CPU, and FPGA etc., currently they are using monolithic integration to put more circuits as many as possible. But, as shown in FIG. 6(*a*), maximizing die area of each monolithic die will be limited by the maximum reticle size of the lithography steppers which is hard to expand because of state-of-the-art existing photolithography exposure tools. For example, as shown in FIG. 6(*b*), current i193 and EUV lithography steppers have a maximum reticle size, thus, a monolithic SOC die has a scanner maximum field area (SMFA) of 26 mm by 33 mm, or 858 $mm^2$ (https://en.wikichip.org/wiki/mask). However, for high performance computing or AI purpose, the high-end consumer GPU seem to run in the 500-600 $mm^2$. As a result, it's getting harder or impossible to make two or more major function blocks such as GPU and FPGA (for example) on a single die. Also since the most widely used 6-Transistor CMOS SRAM Cells are quite large to increase the embedded SRAM (eSRAM) size enough for both major blocks, too. Additionally, the external DRAM capacity needs to be expanded, but the discrete POP (Package on Package, eg. HBM to SOC) or POD (Package DRAM on SOC Die) is still constrained by difficulties of achieving desired performance of worse die-to-chip or package-to-chip signal interconnections.

Thus, there is a need to propose a new integration system including a logic chip with HPC and a SRAM chip with a high storage volume which could solve the above-mentioned problems such that more powerful and efficient SOC or AI single chip based on monolithic integration in the near future could come true.

SUMMARY OF THE DISCLOSURE

One aspect of the present disclosure is to provide an integration system, wherein the integration system includes a first monolithic die and a second monolithic die. The first monolithic die has a processing unit circuit formed therein; and the second monolithic die has a plurality of SRAM arrays formed therein. Wherein the second monolithic die comprises at least 2G Bytes; and the first monolithic die is electrically connected to the second monolithic die.

In one embodiment of the present disclosure, the first monolithic die has a die area the same or substantially the same as a scanner maximum field area defined by a specific technology process node, and the second monolithic die has a die area the same or substantially the same as the scanner maximum field area defined by the specific technology process node.

In one embodiment of the present disclosure, the scanner maximum field area is not greater than 26 mm by 33 mm, or 858 $mm^2$.

In one embodiment of the present disclosure, the first monolithic die and the second monolithic die are enclosed within a single package.

In one embodiment of the present disclosure, the plurality of SRAM arrays include 20GBytes.

In one embodiment of the present disclosure, the processing unit circuit comprising a first processing unit circuit and a second processing unit circuit, wherein the first processing unit circuit includes a plurality of first logic cores, and each of the first logic cores includes a first SRAM size; the second processing unit circuit includes a plurality of second logic cores, and each of the second logic cores includes a second SRAM size.

In one embodiment of the present disclosure, a major function performed by the first processing unit circuit is different from a major function performed by the second processing unit circuit.

In one embodiment of the present disclosure, the first processing unit circuit or the second processing unit circuit is selected from a group consisting of a graphic processing unit (GPU), a central processing unit (CPU), a tensor processing unit (TPU), a network processing unit (NPU) and a field programmable gate array (FPGA).

In one embodiment of the present disclosure, the first monolithic die further includes a L1 cache and a L2 cache utilized by the processing unit circuit during operation of the first monolithic die, and the plurality of SRAM arrays includes a L3 cache and a L4 cache utilized by the processing unit circuit during operation of the first monolithic die.

In one embodiment of the present disclosure, the integration system further includes a third monolithic die in which a plurality of SRAM arrays are formed, wherein the third monolithic die comprises at least 2~20G Bytes, and the first monolithic die, the second monolithic die and the third monolithic die are enclosed within a single package, and wherein the first monolithic die has a die area the same or substantially the same as a scanner maximum field area defined by a specific technology process node, the second monolithic die has a die area the same or substantially the same as the scanner maximum field area defined by the specific technology process node, and the third monolithic die has a die area the same or substantially the same as the scanner maximum field area defined by the specific technology process node.

In one embodiment of the present disclosure, the first monolithic die, the second monolithic die and the third monolithic die are vertically stacked.

Another aspect of the present disclosure is to provide an integration system, wherein the integration system includes a first monolithic die and a second monolithic die. The first monolithic die has a processing unit circuit; and the second monolithic die has a plurality of SRAM arrays, wherein the plurality of SRAM arrays include at least 2G Bytes; the first monolithic die is physically separate from the second monolithic die, and the first monolithic die is electrically connected to the second monolithic die; the integration system includes no high bandwidth memory (HBM).

In one embodiment of the present disclosure, the second monolithic die has an area size the same or substantially the same as a scanner maximum field area defined by a specific technology process node; and the first monolithic die has an area size the same or substantially the same as the scanner maximum field area defined by the specific technology process node.

In one embodiment of the present disclosure, the first monolithic die and the second monolithic die are enclosed within a single package, and the first monolithic chip is electrically connected to the second monolithic chip through wire bonding, flip chip bonding, solder bonding, interpose through silicon via (TSV) bonding, or micro cupper pillar direct bonding.

Another aspect of the present disclosure is to provide an integration system, wherein the integration system includes a first monolithic circuit and a second monolithic circuit. The first monolithic circuit has a processing unit circuit; and the second monolithic circuit with a plurality of SRAM arrays, wherein the plurality of SRAM arrays include at least 2-20G Bytes; the first monolithic circuit is electrically connected to the second monolithic circuit; the first monolithic circuit is formed in a first monolithic die and the second monolithic circuit is formed in a second monolithic die; and the first monolithic die and the second monolithic die are enclosed in a single package, or the first monolithic die and the second monolithic die are enclosed in a first package and a second package respectively.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings:

FIG. 4(*b*) (prior art) is the stick diagram illustrating the dimensions of the Samsung 5 nm (UHD) standard cell as show in FIG. 4(*a*);

FIG. 7(*b*) is a cross-sectional view taken along the cutting line C7J1 as depicted in FIG. 7(*a*);

FIG. 7(*c*) is a cross-sectional view taken along the cutting line C7J2 as depicted in FIG. 7(*a*);

FIG. 8(*b*) is a cross-sectional view of the PMOS transistor and the NMOS transistor taking along the cutline (X-axis) in FIG. 8(*a*);

FIG. 9(*b*) is a diagram illustrating the comparison result among the area size of the new standard cell provided by the preset invention and that of the conventional products provided by various other companies;

FIG. 11(*b*) is a diagram illustrating a single monolithic die of an integration system provided by the integrated scaling and stretching platform according to another embodiment of the present disclosure;

FIG. 11(*c*) is a diagram illustrating a single monolithic die of an integration system provided by the integrated scaling and stretching platform according to yet another embodiment of the present disclosure;

FIG. 11(*d*) is a diagram illustrating a single monolithic die of an integration system provided by the integrated scaling and stretching platform according to further another embodiment of the present disclosure;

FIG. 12(*b*) is a diagram illustrating the comparison results of the SRAM cell area among the integration system of the present invention and that of three foundries based on different technology nodes;

FIG. 13(*b*) is a diagram illustrating a single monolithic die of an integration system provided by the integrated scaling and stretching platform according to yet another embodiment of the present disclosure;

DETAILED DESCRIPTION OF THE DISCLOSURE

The present disclosure provides an integration system. The above and other aspects of the disclosure will become better understood by the following detailed description of the preferred but non-limiting embodiment(s). The following description is made with reference to the accompanying drawings:

Several embodiments of the present disclosure are disclosed below with reference to accompanying drawings. However, the structure and contents disclosed in the embodiments are for exemplary and explanatory purposes only, and the scope of protection of the present disclosure is not limited to the embodiments. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification.

Embodiment 1

The disclosure has proposed to integrate the following inventions:

a. new transistors (presented in the U.S. patent application Ser. No. 17/138,918, filed on Dec. 31, 2020 and entitled: "MINIATURIZED TRANSISTOR STRUCTURE WITH CONTROLLED DIMENSIONS OF SOURCE/DRAIN AND CONTACT-OPENING AND RELATED MANUFACTURE METHOD", and the whole content of the U.S. patent application Ser. No. 17/138,918 is incorporated by reference herein; presented in the U.S. patent application Ser. No. 16/991,044, field on Aug. 12, 2020 and entitled "TRANSISTOR STRUCTURE AND RELATED INVERTER", and the whole content of the U.S. patent application Ser. No. 16/991,044 is incorporated by reference herein; and presented in the U.S. patent application Ser. No. 17/318,097, field on May 12, 2021 and entitled "COMPLEMENTARY MOSFET STRUCTURE WITH LOCALIZED ISOLATIONS IN SILICON SUBSTRATE TO REDUCE LEAKAGES AND PREVENT LATCH-UP", and the whole content of the U.S. patent application Ser. No. 17/318,097 is incorporated by reference herein);

b. interconnection-to-transistor (presented in the U.S. application Ser. No. 17/528,957, filed on Nov. 17, 2021 and entitled "INTERCONNECTION STRUCTURE AND MANUFACTURE METHOD THEREOF", and the whole content of the U.S. Provisional Application No. 617/528,957 is incorporated by reference herein);

c. SRAM cell (presented in the U.S. application Ser. No. 17/395,922, filed on Aug. 6, 2021 and entitled "NEW SRAM CELL STRUCTURES", and the whole content of the U.S. application Ser. No. 17/395,922 is incorporated by reference herein); and d. Standard-Cell designs (presented in the U.S. Provisional Application No. 63/238,826, filed on Aug. 31, 2021 and entitled "STANDARD CELL STRUCTURES", and the whole content of the U.S. Provisional Application No. 63/238,826 is incorporated by reference herein).

Figure 7A:
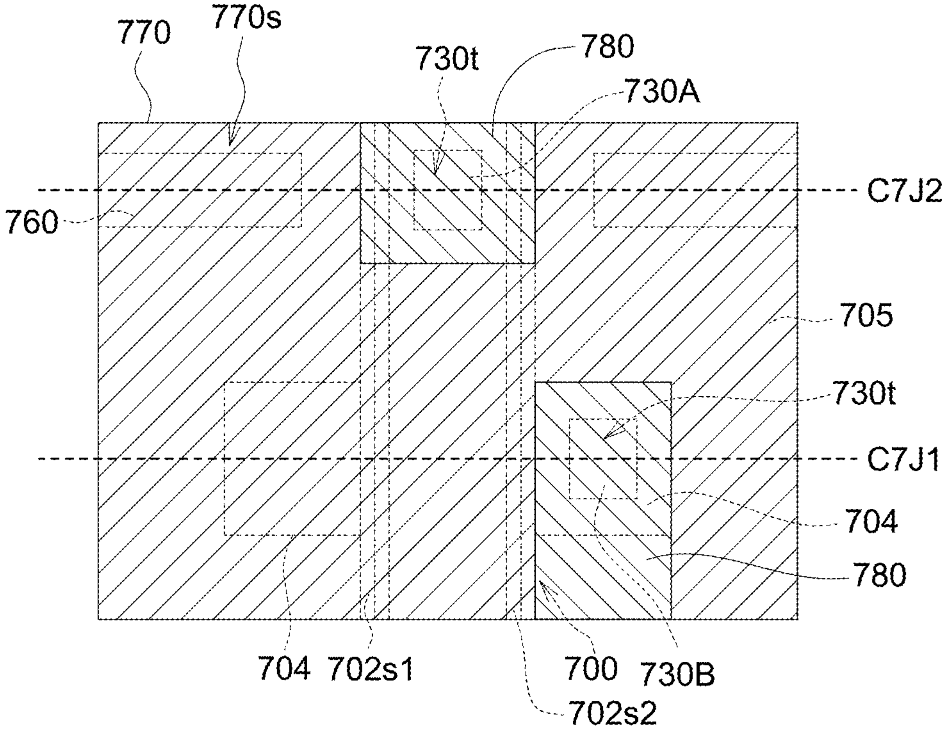
FIG. 7(*a*) is a top view illustrating a mMOSFET used in a new standard cell according to one embodiment of the present disclosure.
Figure 7B:
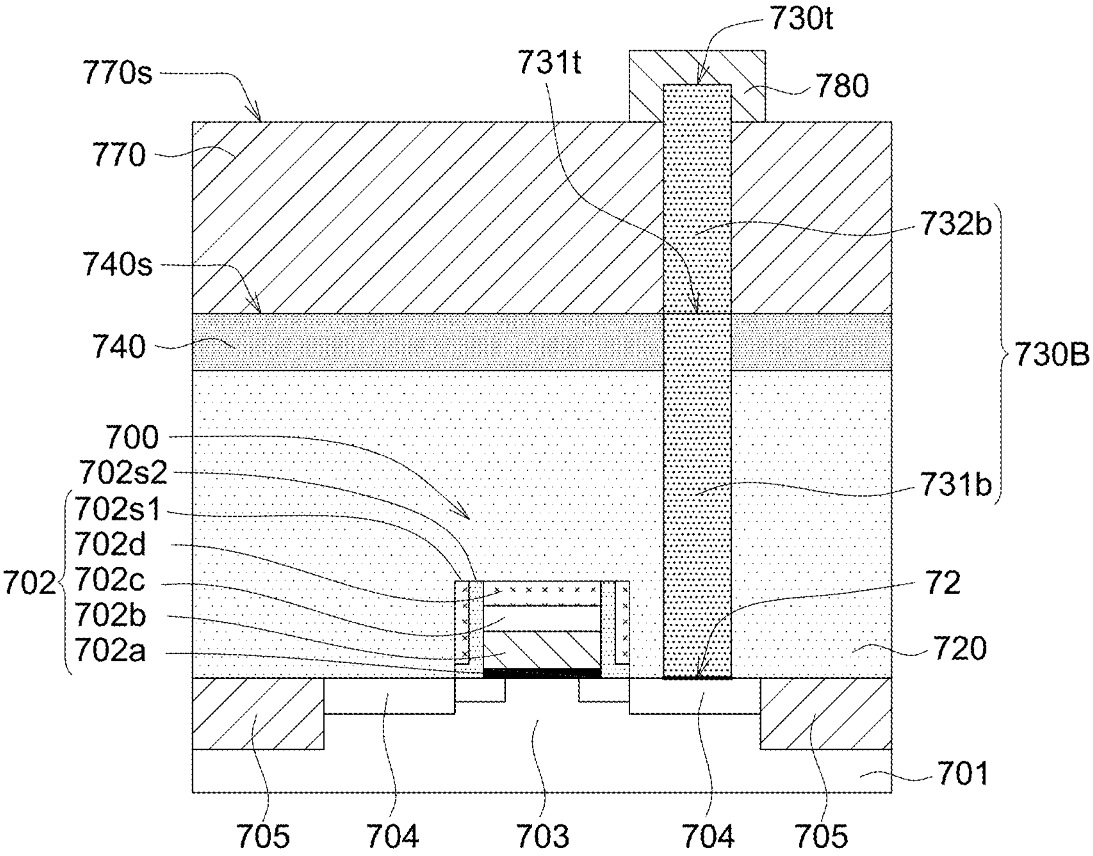
Figure 7C:
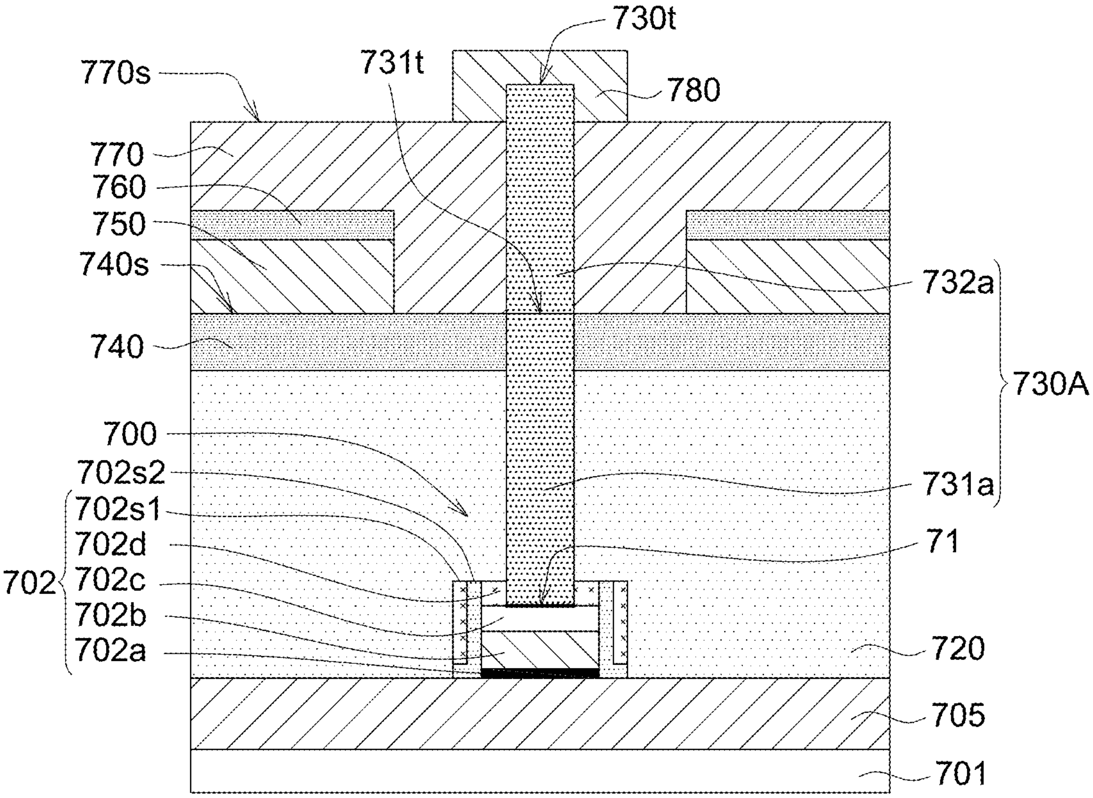

For example, FIG. 7(*a*) is a top view illustrating a MOSFET structure according to one embodiment of the present disclosure. FIG. 7(*b*) is a cross-sectional view taken along the cutting line C7J1 as depicted in FIG. 7(*a*). FIG. 7(*c*) is a cross-sectional view taken along the cutting line C7J 2 as depicted in FIG. 7(*a*). In the proposed MOSFET, each the silicon region of the gate terminal (such as the silicon region 702*c*) and the silicon region of the source/drain terminal are exposed and has seed regions for the selective epitaxy growth technique (SEG) to grow pillars (such as a first conductor pillar portion 731*a* and a third conductor pillar portion 731*b*) based on the seed regions.

Furthermore, each of the first conductor pillar portions 731*a* and the third conductor pillar portion 731*b* also has a seed region or seed pillar in the upper portion thereof, and such seed region or seed pillar could be used for the following selective epitaxy growth. Subsequently, a second conductor pillar portion 732*a* is formed on the first conductor pillar 731*a* by a second selective epitaxy growth; and a fourth conductor pillar portion 732*b* is formed on the third conductor pillar portion 731*b*.

This embodiment, as shown in FIGS. 7(*a*)-7(*c*), could be applied to allows M1 interconnection (a kind of conductive terminal) or conduction layer to be directly connected to the MX interconnection layer (without connecting to the conduction layers M2, M3, . . . MX-1) in a self-alignment way through one vertical conductive or conductor plug, as long as there is a seed portion or seed pillar on the upper portion of the conductive terminal and the conductor pillar portions configured for following selective epitaxy growth technique. The seed portion or seed pillar is not limited to silicon, and any material which could be used as a seed configured for following selective epitaxy growth is acceptable.

Figure 8A:
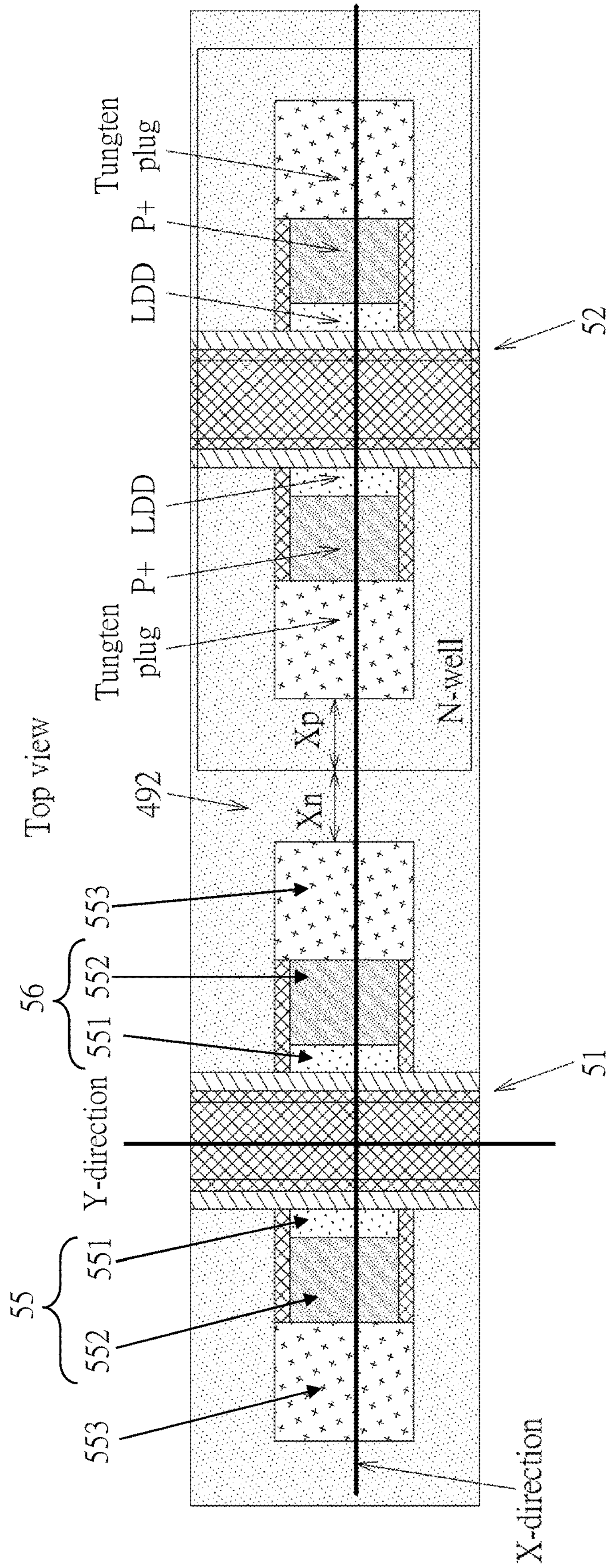
FIG. 8(*a*) is a top view illustrating a combination structure of the PMOS transistor and the NMOS transistor used in a new standard cell according to one embodiment of the present embodiment.
Figure 8B:
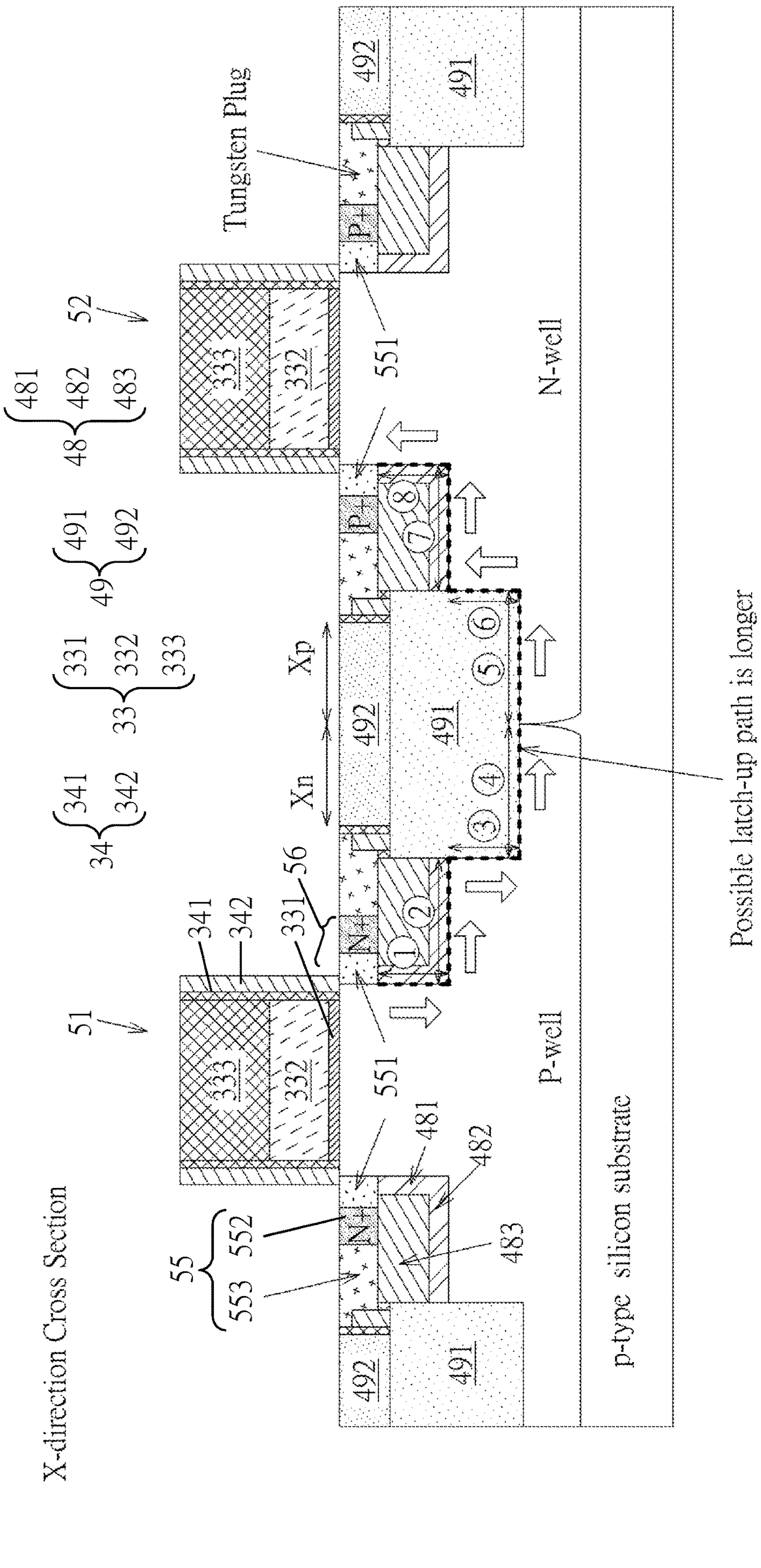

FIG. 8(*a*) is a top view illustrating a combination structure of the PMOS transistor 52 and the NMOS transistor 51 according to one embodiment of the present embodiment. FIG. 8(*b*) is a cross-sectional view of the PMOS transistor 52 and the NMOS transistor 51 taking along the cutline (X-axis) in FIG. 8(*a*). The structure of the PMOS transistor 52 is identical to that of the NMOS transistor 51. The gate structure 33 comprising a gate dielectric layer 331 and gate conductive layer 332 (such as gate metal) is formed above the horizontal surface or original surface of the semiconductor substrate (such as silicon substrate). A dielectric cap 333 (such as a composite of oxide layer and a Nitride layer) is over the gate conductive layer 332. Furthermore, spacers 34 which may include a composite of an oxide layer 341 and a Nitride layer 342 is used to over sidewalls of the gate structure 33. Trenches are formed in the silicon substrate, and all or at least part of the source region 55 and drain region 56 are positioned in the corresponding trenches, respectively. The source (or drain) region in the MOS transistor 52 may include N+ region or other suitable doping profile regions (such as gradual or stepwise change from P− region and P+ region).

Furthermore, a localized isolation 48 (such as nitride or other high-k dielectric material) is located in one trench and positioned under the source region, and another localized isolation 48 is located in another trench and positioned under the drain region. Such localized isolation 48 is below the horizontal silicon surface (HSS) of the silicon substrate and could be called as localized isolation into silicon substrate (LISS) 48. The LISS 48 could be a thick Nitride layer or a composite of dielectric layers. For example, the localized isolation or LISS 48 could comprise a composite localized isolation which includes an oxide layer 481 covering at least a portion sidewall of the trench and another oxide layer 482 covering at least a portion bottom wall of the trench. The oxide layers 481 and 482 could be L-Shape oxide layer formed by thermal oxidation process.

The composite localized isolation 48 could further include a nitride layer 483 being over the oxide layer 482 or/and the oxide layer 481. The shallow trench isolation (STI) region could comprise a composite STI 49 which includes a STI-1 layer 491 and a STI-2 layer 492, wherein the STI-1 layer 491 and a STI-2 layer 492 could be made of thick oxide material by different process, respectively.

Moreover, the source (or drain) region could comprise a composite source region 55 and/or drain region 56. For example, in the NMOS transistor 52, the composite source region 55 (or drain region 56) at least comprises a lightly doped drain (LDD) 551 and an N+ heavily doped region 552 in the trench. Especially, it is noted that the lightly doped drain (LDD) 551 abuts against an exposed silicon surface with a uniform (110) crystalline orientation. The exposed silicon surface has its vertical boundary with a suitable recessed thickness in contrast to the edge of the gate structure. The exposed silicon surface is substantially aligned with the gate structure. The exposed silicon surface could be a terminal face of the channel of the transistor.

The lightly doped drain (LDD) 551 and the N+heavily doped region 552 could be formed based on a selective epitaxial growth (SEG) technique (or other suitable technology which may be Atomic Layer Deposition ALD or selective growth ALD-SALD) to grow silicon from the exposed TEC area which is used as crystalline seeds to form new well-organized (110) lattice across the LISS region which has no seeding effect on changing (110) crystalline structures of newly formed crystals of the composite source region 55 or drain region 56. Such newly formed crystals (including the lightly doped drain (LDD) 551 and the N+ heavily doped region 552) could be named as TEC-Si.

In one embodiment, the TEC is aligned or substantially aligned with the edge of the gate structure 33, and the length of the LDD 551 is adjustable, and the sidewall of the LDD 551 opposite to the TEC could be aligned or substantially aligned with the sidewall of the spacer 34. The composite source (or drain) region could further comprise some tungsten (or other suitable metal materials, such as TiN/Tungsten) plugs 553 formed in a horizontal connection to the TEC-Si portion for completion of the entire source/drain regions. The active channel current flowing to future Metal interconnection such as Metal-1 layer is gone through the LDD 551 and the N+ heavily-doped region 552 to tungsten 553 (or other metal materials) which is directly connected to Metal-1 by some good Metal-to-Metal Ohmic contact with much lower resistance than the traditional Silicon-to-Metal contact.

The source/drain contact resistance of the NMOS transistor 52 can be kept for a reasonable range according to the structure of the merged metal-semiconductor junction utilized in the source/drain structure. This merged metal-semiconductor junction in the source/drain structure can improve current crowding effect and reduce contact resistance. Additionally, because the bottom of source/drain structure is isolated from the substrate due to the bottom oxide (oxide layer 482), the n+ to n+ or p+ to p+ isolation can be kept within a reasonable range. Therefore, the spacing between two adjacent active regions of the PMOS transistor (not shown) could be scaled down to 2A. The bottom oxide (oxide layer 482) can significantly reduce source/drain junction leakage current and then reduces n+ to n+ or p+ to p+ leakage current.

It results in a much longer path from the n+/p junction through the p-well (or p-substrate)/n-well junction to the n/p+ junction. As shown in FIG. 8(*b*), the possible Latch-up path from the LDD-n/p junction through the p-well/n-well junction to the n/LDD-p junction includes the length ①, the length ② (the length of the bottom wall of one LISS region), the length ③, the length ④, the length ⑤, the length ⑥, the length ⑦ (the length of the bottom wall of another LISS region), and the length ⑧ marked in FIG. 8(*b*). Such possible Latch-up path is longer than that in a traditional CMOS structure. Therefore, from device layout point of view, the reserved edge distance ($X_n$+$X^p$) between the PMOS transistor 52 and the NMOS transistor 51 could be smaller than that in the traditional CMOS structure. For example, the reserved edge distance ($X_n$+$X_p$) could be around 2~4λ, such as 3λ.

Moreover, it is possible that the composite STI 49 is raised up (such as the STI-2 layer 492 is higher than the original semiconductor surface and up to the top surface of the gate structure, such that the selectively grown source/drain regions will be confined by the composite STI 49 and will not be over the composite STI 49. The metal contact plug (such as Tungsten plug 553) can be deposited in the hole between the composite STI 49 and the gate structure without using another contact mask to create a contact hole. Moreover, the top surface and one sidewall of the heavily-doped region 552 is directly contacted to the metal contact plug, and the contact resistance of the source/drain regions could be dramatically reduced.

Furthermore, in convention design, the metal wires for high level voltage Vdd and low level voltage Vss (or ground) are distributed above the original silicon surface of the silicon substrate, and such distribution will interfere with other metal wires if there no enough spaces among those metal wires. The present invention also discloses a new standard cell or SRAM cell in which the metal wires for high level voltage Vdd and/or the low level voltage Vss could be distributed under the original silicon surface of the silicon substrate, thus, the interference among the size of the contacts, among layouts of the metal wires connecting the high level voltage Vdd, and low level voltage Vss, etc. could be avoided even the size of the standard cell is shrunk.

For example, in the drain region of the NMOS 51, the tungsten or other metal materials 553 is directly coupled to, the P-well (by removing the LISS 48) which is electrically coupled to Vdd. Similarly, in the source region of the NMOS 51, the Tungsten or other metal materials 553 is directly coupled to the p-well or P-substrate (by removing the LISS 48) which is electrically coupled to ground. Thus, the openings for the source/drain regions which are originally used to electrically couple the source/drain regions with metal-2 layer (M2) or metal-3 layer (M3) for Vdd or ground connection could be omitted in the new standard cell and standard cell.

To sum up, at least there are following advantages:

(1) The linear dimensions of the source, the drain and the gate of the transistors in the standard cell/SRAM could be precisely controlled, and the linear dimension can be as small as the minimum feature size, Lambda (λ), as shown in the incorporated U.S. patent application Ser. No. 17/138,918. Therefore, when two adjacent transistors are connected together through the drain/source, the length dimension of the transistor would be as small as 3λ, and the distance between the edges of the gates of the two adjacent transistors could be as small as 2λ. Of course, for tolerance purpose, the length dimension of the transistor would be around 3λ~6λ or larger, the distance between the edges of the gates of the two adjacent transistors could be 8λ or larger.

(2) The first metal interconnection (M1 layer) directly connect Gate, Source and/or Drain regions through self-aligned miniaturized contacts without using a conventional contact-hole-opening mask and/or a Metal-0 translation layer for M1 connections.

(3) The Gate and/or Diffusion (Source/Drain) areas are directly connected to the metal-2 (M2) interconnection layer without connecting the metal-1 layer (M1) in a self-alignment way. Therefore, the necessary space between one metal-1 layer (M1) interconnection layer and the other metal-1 layer (M1) interconnection layer and blocking issue in some wiring connections will be reduced. Furthermore, same structure could be applied to a lower metal layer is directly connected to an upper metal layer by a conductor pillar, but the conductor pillar is not electrically connected to any middle metal layer between the lower metal layer and the upper metal layer.

(4) The metal wires for high level voltage Vdd and/or the low level voltage VSS in the standard cell could be distributed under the original silicon surface of the silicon substrate, thus, the interference among the size of the contacts, among layouts of the metal wires connecting the high level voltage Vdd, and low level voltage Vss, etc. could be avoided even the size of the standard cell is shrunk. Moreover, the openings for the source/drain regions which are originally used to electrically couple the source/drain regions with metal-2 layer (M2) or metal-3 layer (M3) for Vdd or Ground connection could be omitted in the new standard cell and standard cell.

Figure 1:
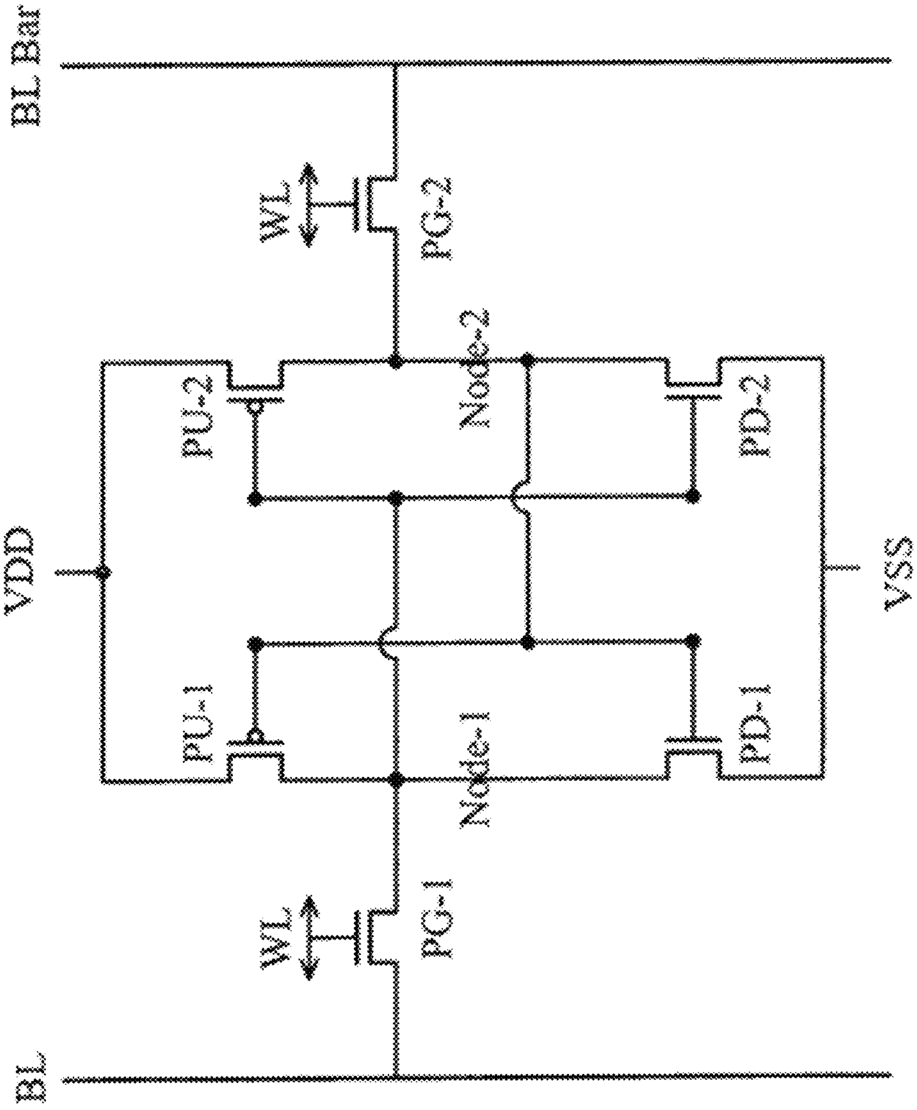
FIG. 1 (Prior art)
FIG. 1 (prior art) is a schematic diagram for a regular 6T SRAM cell.
Figure 2:
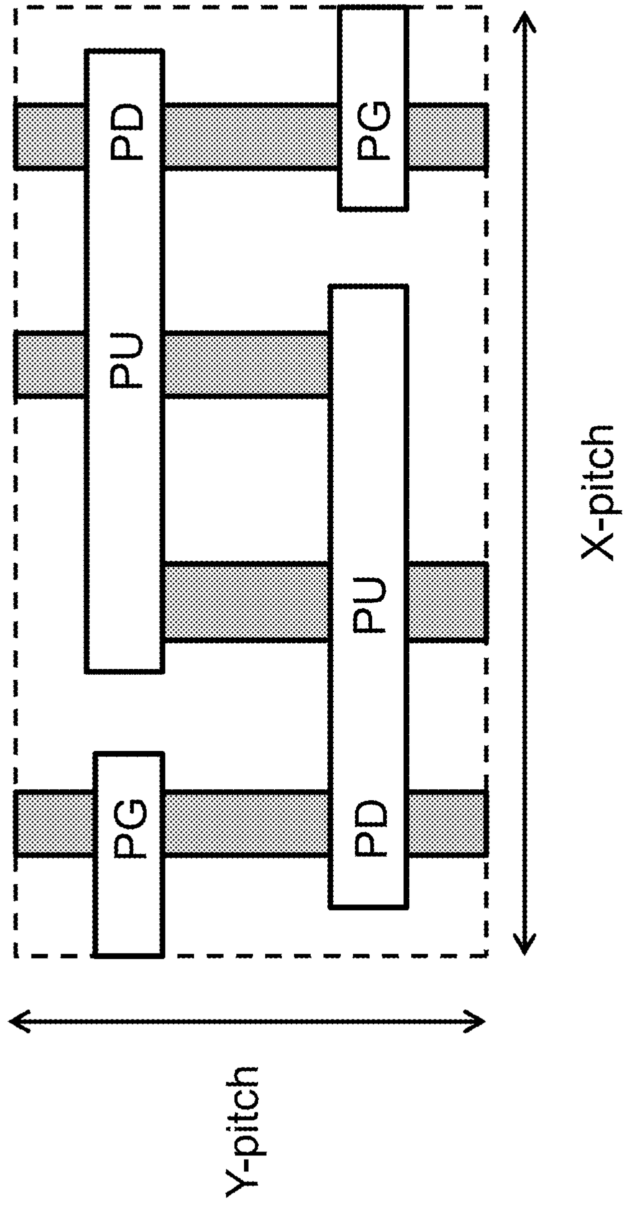
FIG. 2 (Prior art)
FIG. 2 (prior art) is a stick diagram corresponding to the 6T SRAM in FIG. 1.
Figure 3:
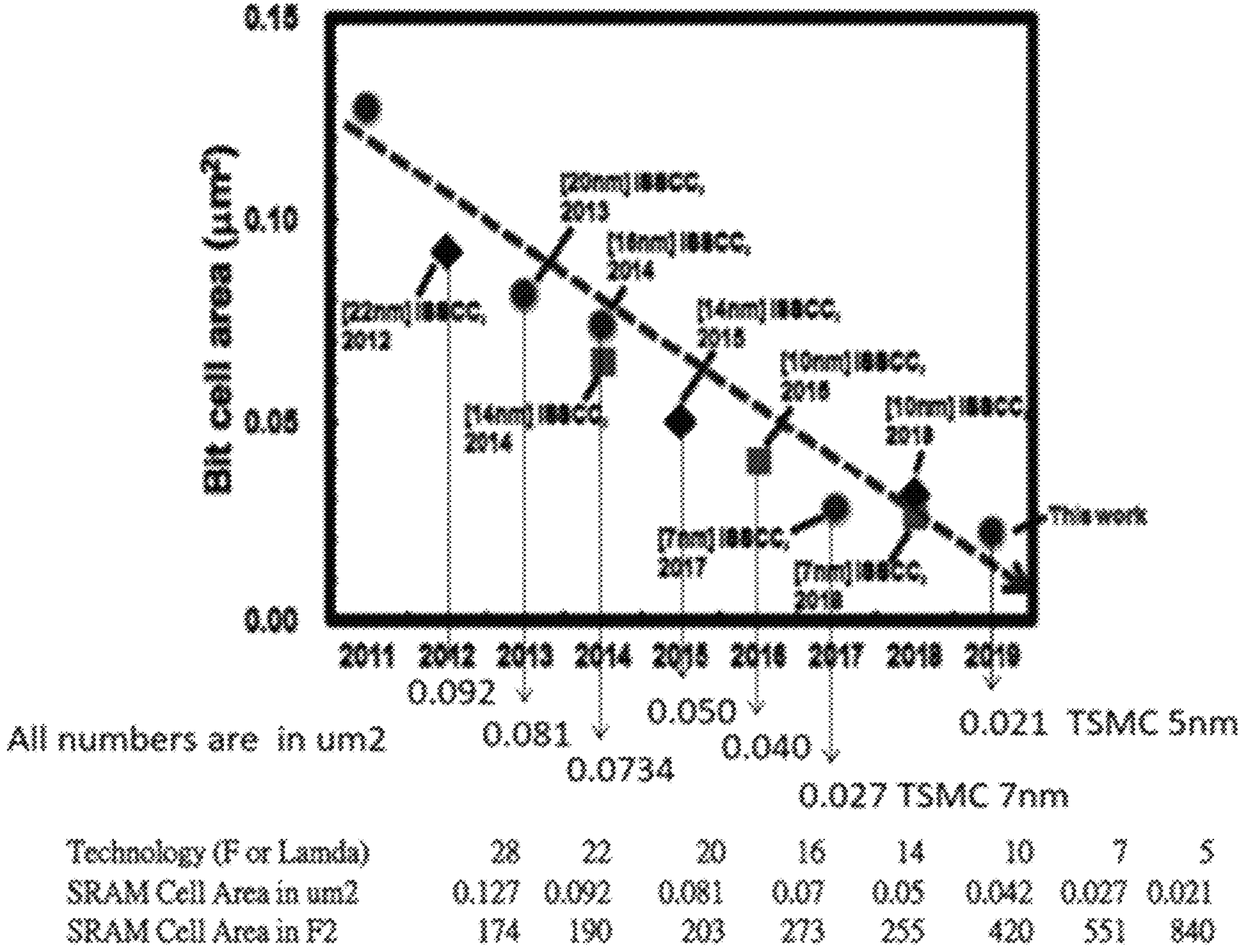
FIG. 3 (Prior art)
FIG. 3 (prior art) is a diagram illustrating the total area of the SRAM cell in terms of $\lambda^2$ (or $F^2$) for different process dimension λ (or F) according to the currently available manufacture processes.
Figure 5:
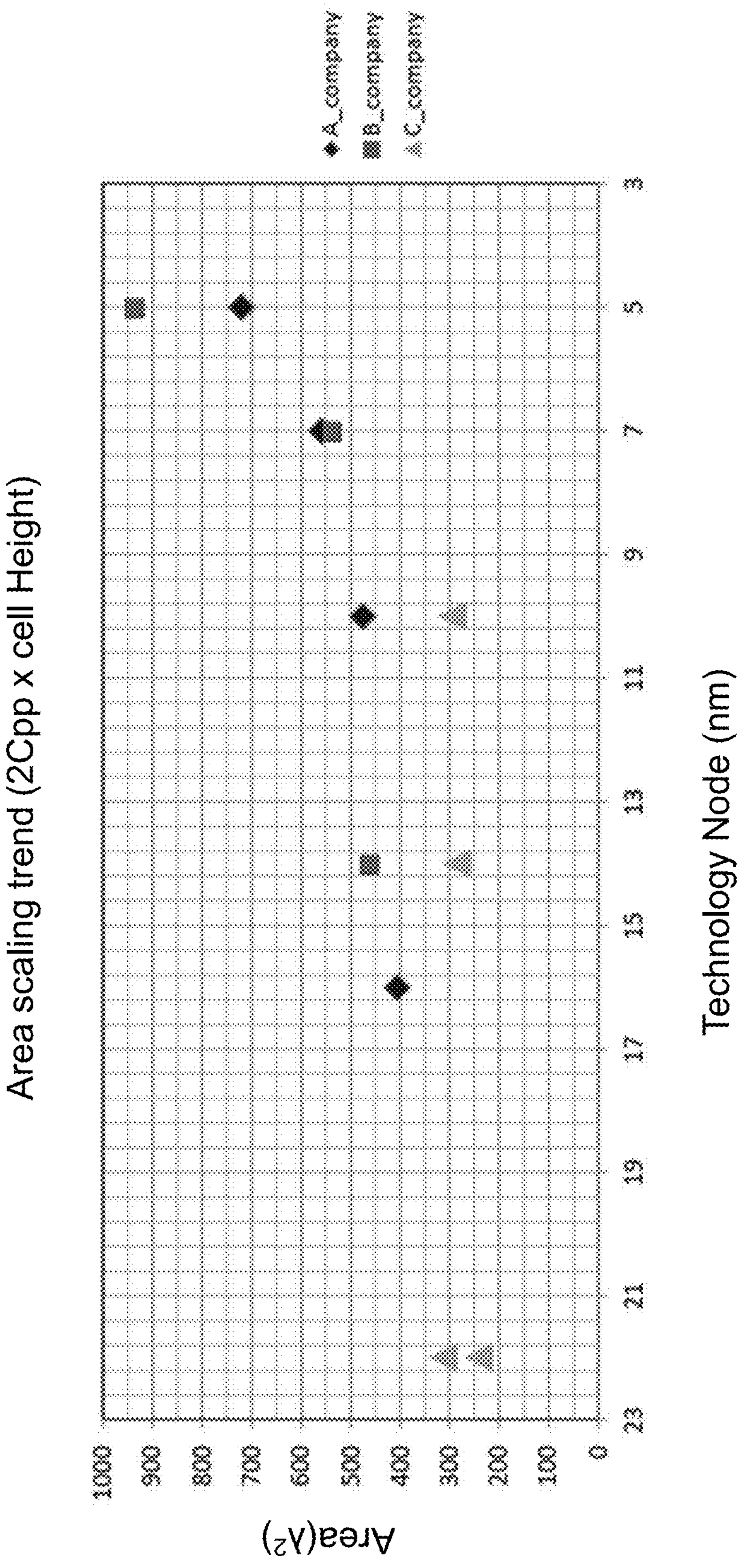
FIG. 5 (Prior art)
FIG. 5 (prior art) illustrates the scaling trend regarding area size v. different process technology node for three foundries.
Figure 6A:
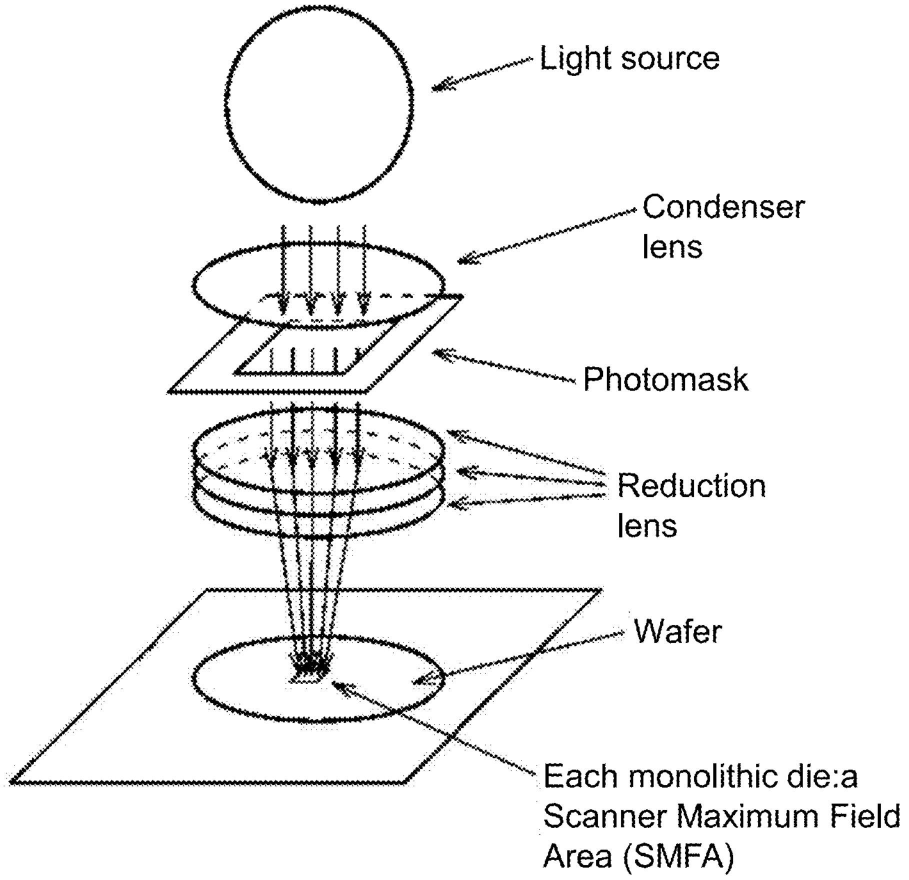
FIG. 6(a) (Prior art)
FIG. 6(*a*) (prior art) and FIG. 6(*b*) (prior art) are diagrams illustrating a monolithic SOC die with a scanner maximum field area (SMFA) which is limited by the maximum reticle size of the lithography steppers.
Figure 6B:
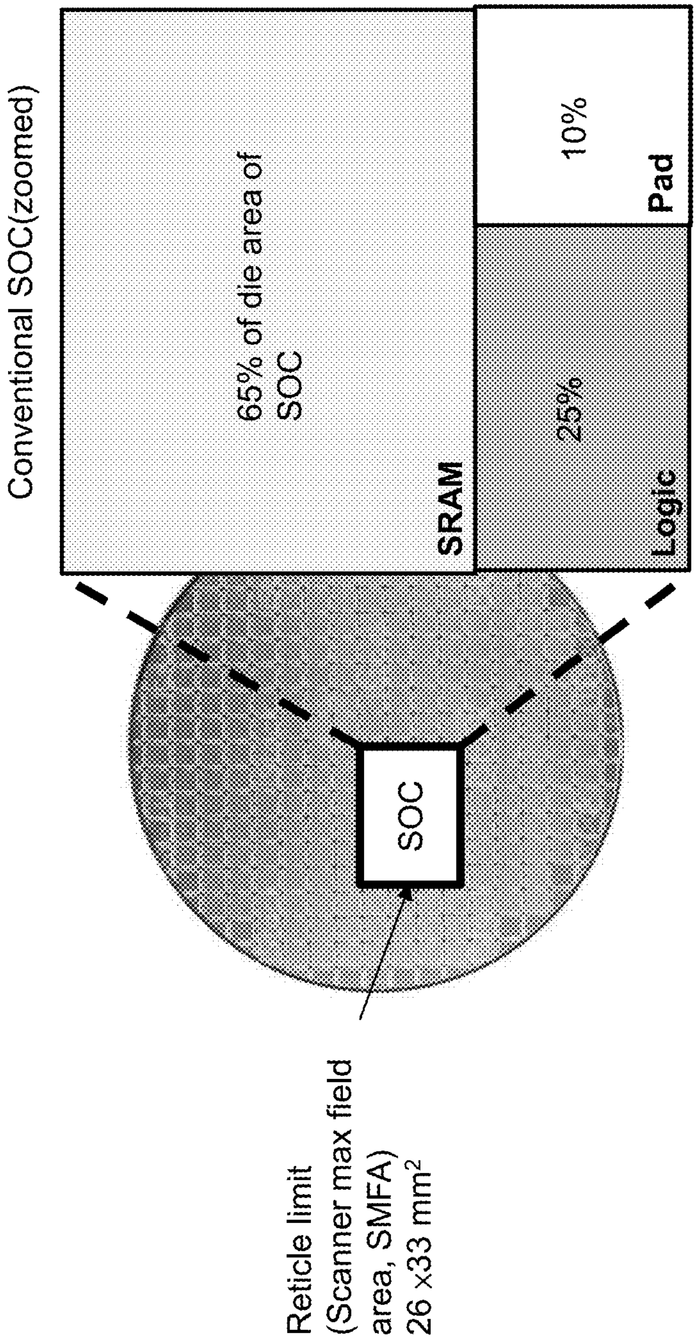
FIG. 6(b) (Prior art)
Figure 9A:
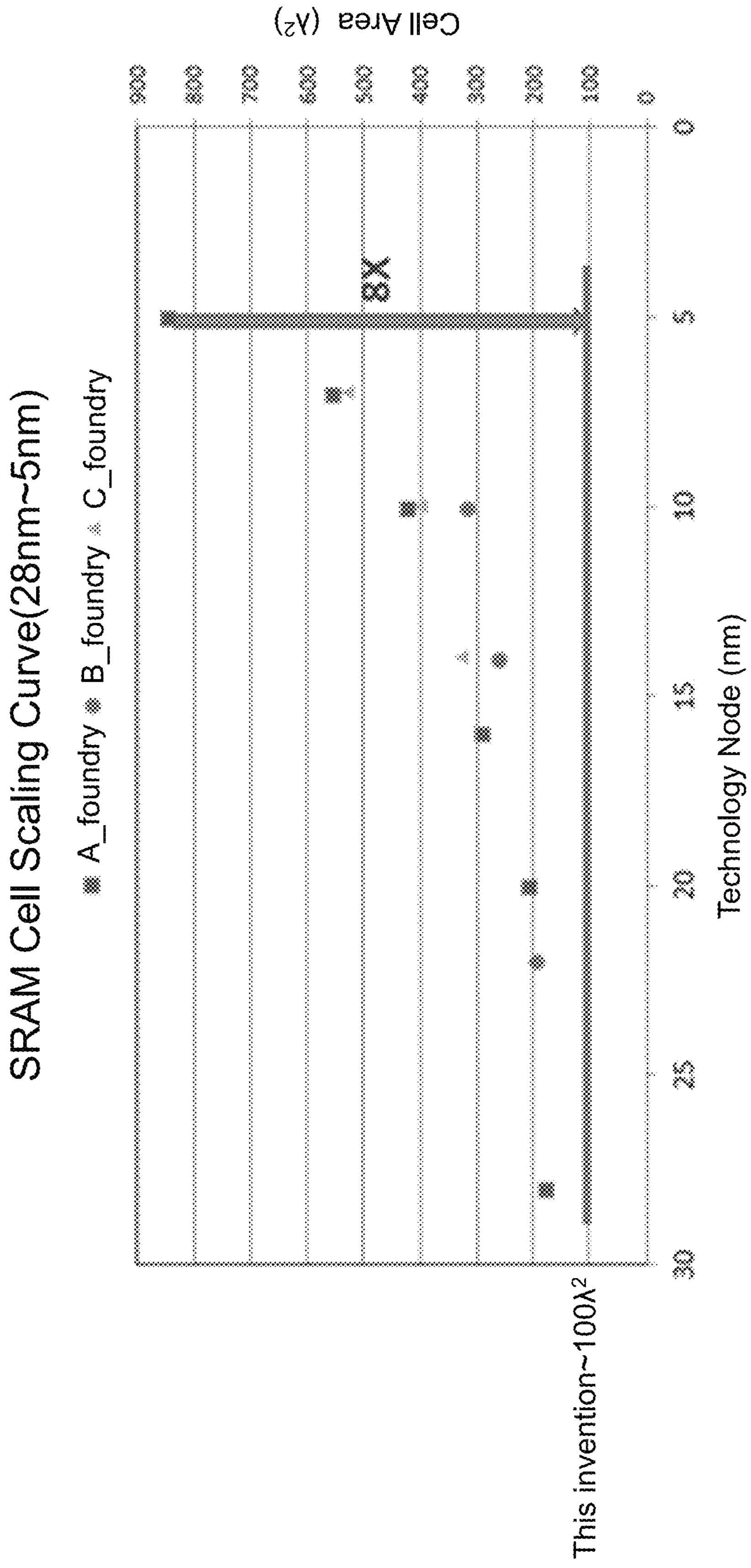
FIG. 9(*a*) is a diagram illustrating the SRAM bit cell size (in term of $\lambda^2$) can be observed across different technology nodes from three different companies and the present invention.
Figure 9B:
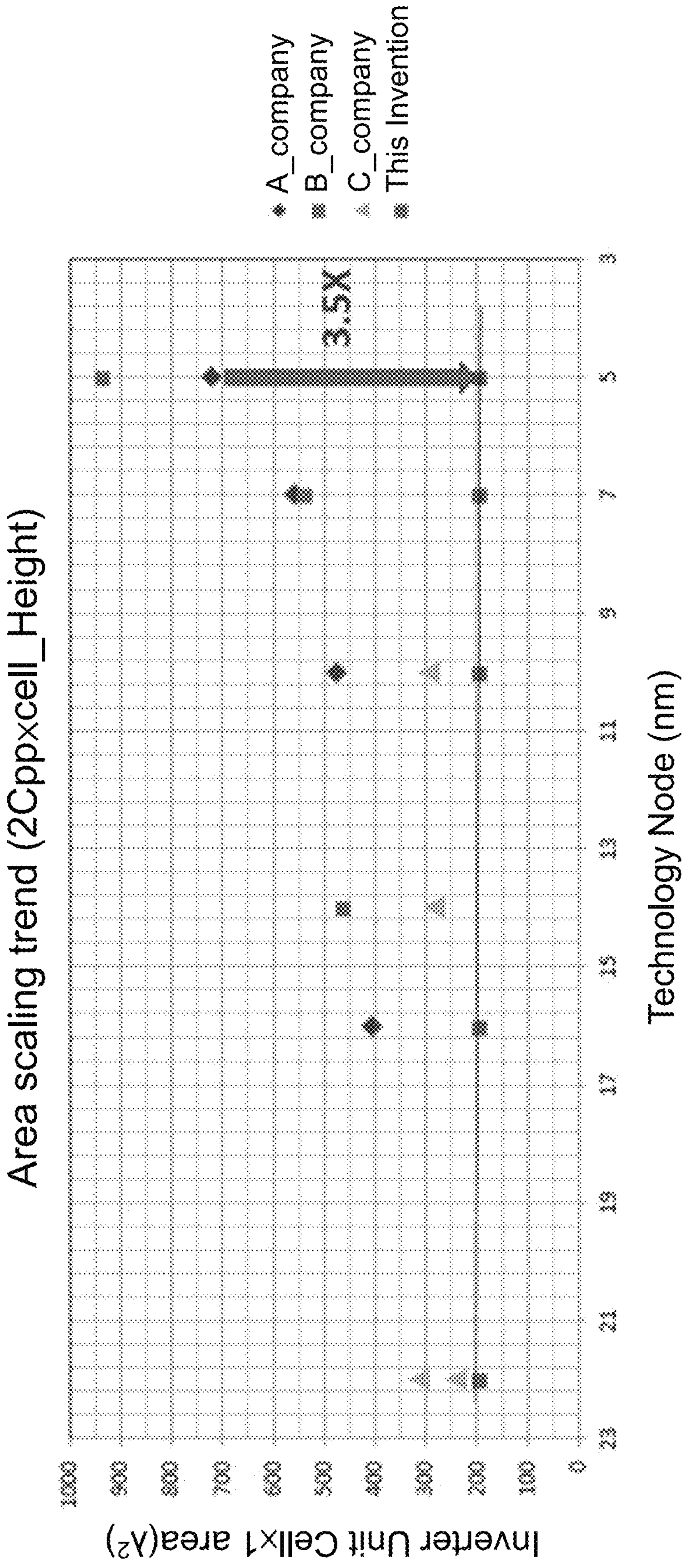

Based on the above-mentioned, FIG. 9(*a*) is a diagram illustrating the SRAM bit cell size (in term of $\lambda^2$) can be observed across different technology nodes from three different companies and the present invention. FIG. 9(*b*) is a diagram illustrating the comparison result among the area size of the new standard cell provided by the preset invention and that of the conventional products provided by various other companies. As shown in FIG. 9(*a*), the area of the new proposed SRAM cell (the present invention) could be around $100\lambda^2$, which is almost one eighth (⅛) of the area of the conventional 5 nm SRAM cell (of three different companies) shown in FIG. 3. Moreover, as shown in FIG. 9(*b*), the area of the new proposed standard cell (such as inverter cell could be as smaller as $200\lambda^2$) is around 1/3.5 of the area of the conventional 5 nm standard cell shown in FIG. 5.

Therefore, an innovation of an integrated scaling and/or stretching platform (ISSP) in its monolithic die design is proposed to provide an integration system, with any combination of the proposed technologies (such as, new transistor, interconnection-to-transistor, SRAM cell and standard-cell designs), such that an original schematic circuit of die that can be scaled down in its area by 2~3 times or more.

In another view, more SRAMs or more major different function blocks (CPU or GPU) could be formed in the original size of a single monolithic die. Thus, the device density and computing performance of an integration system (such as, an AI chip or SOC) can be significantly increased, in comparison with the conventional one having the same size, without shrinking the technology nodes for manufacturing the integration system.

Figure 4A:
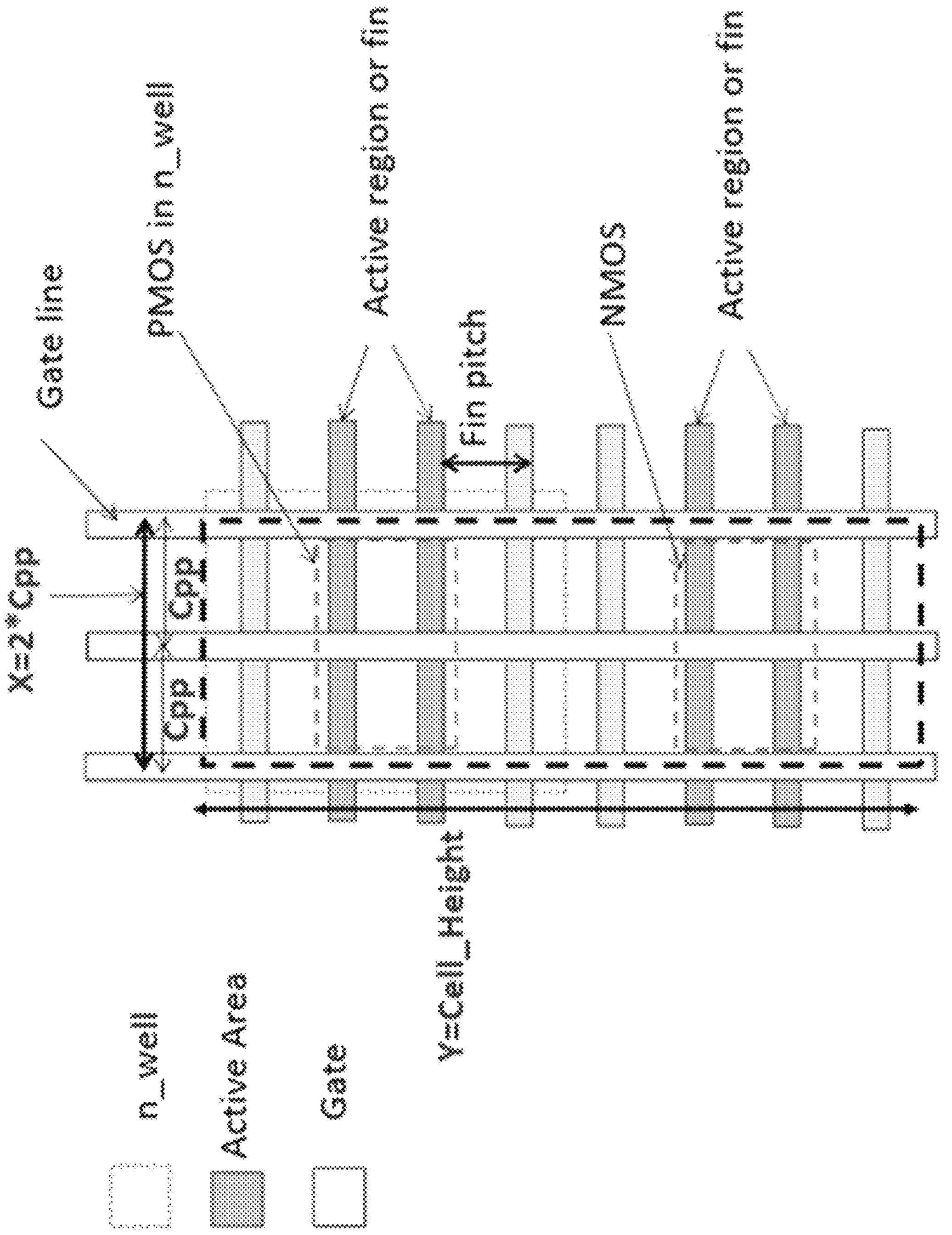
FIG. 4(a) (Prior art)
FIG. 4(*a*) (prior art) shows the "stick diagram" representing the layout and connection among PMOS and NMOS transistors of one semiconductor company's (Samsung) 5 nm (UHD) standard cell.
Figure 4B:
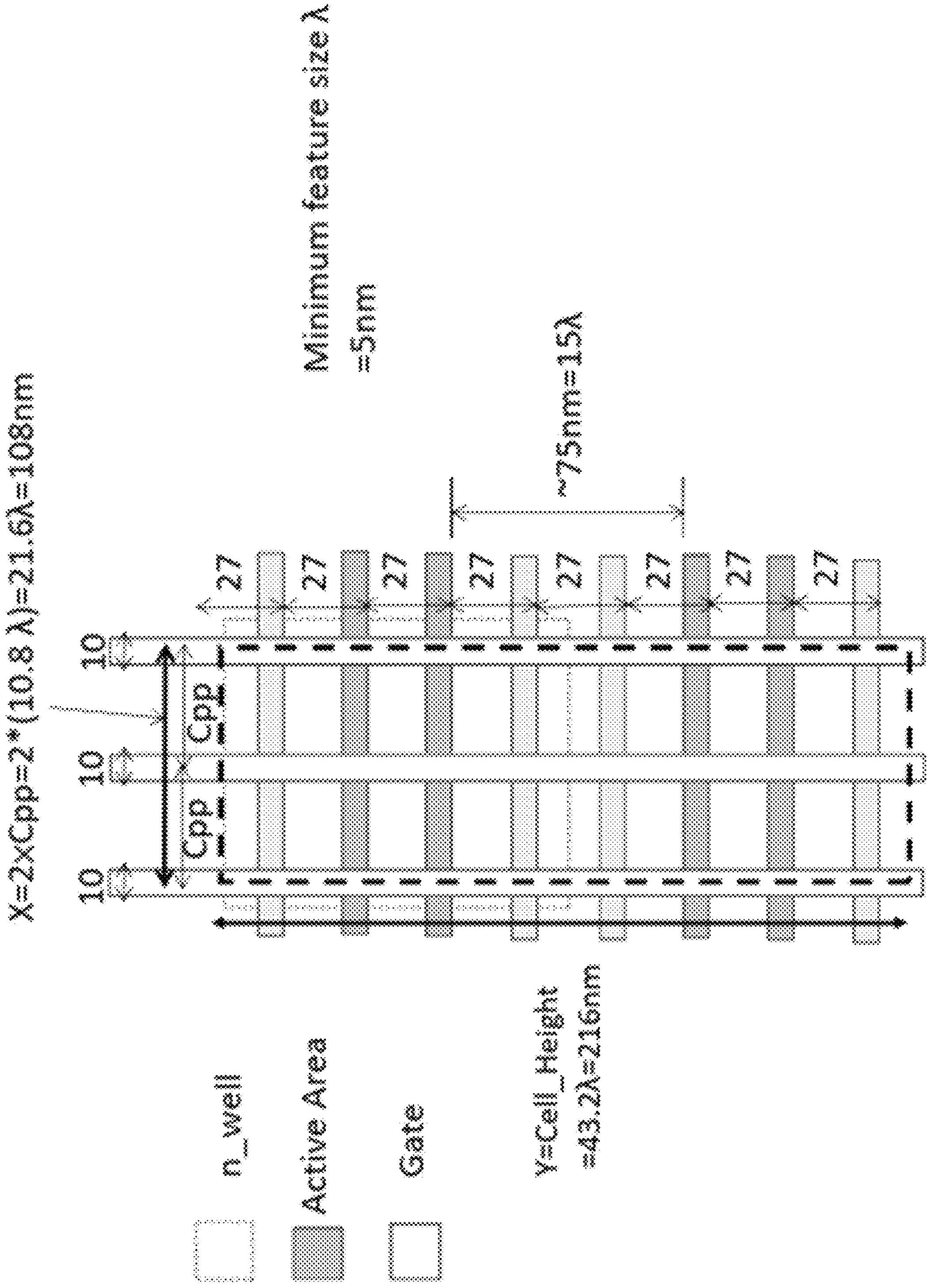
FIG. 4(b) (Prior art)

Using 5 nm technology process node as example, a CMOS 6-T SRAM cell size can be shrunken to about 100 $F^2$ (where F is the minimum feature size made on silicon wafers) as shown in FIG. 9(*a*). That is, if F=5 nm, then the SRAM cell can occupy about 2500 $nm^2$ in contrast to the state-of-the-art cell area around 800 $F^2$ based on publications (i.e., shrunken by 8×). Moreover, an 8-finger CMOS Inverters (shown in FIGS. 4(*a*) and 4(*b*)) should consume a die area of 200 $F^2$ based on the present invention, in contrast to that of the published conventional CMOS Inverter more than 700 $F^2$ (5 nm process node in FIG. 9(*b*)).

That is, in the event a single monolithic die has a circuit (such as a SRAM circuit, a logic circuit, a combination of a SRAM and a logic circuit, or a major function block circuit CPU, GPU, FPGA, etc.) which occupies a die area (such as Y $nm^2$) based on a technology process node, with the help of the present invention, the total area of the monolithic die with the same schematic circuit could be shrunk, even the monolithic die is still manufactured by the same technology process node. The new die area occupied by the same schematic circuit in the monolithic die will be smaller than the original die area, such as be 20% to 80% (or 30% to 70%) of Y $nm^2$.

Figure 10:
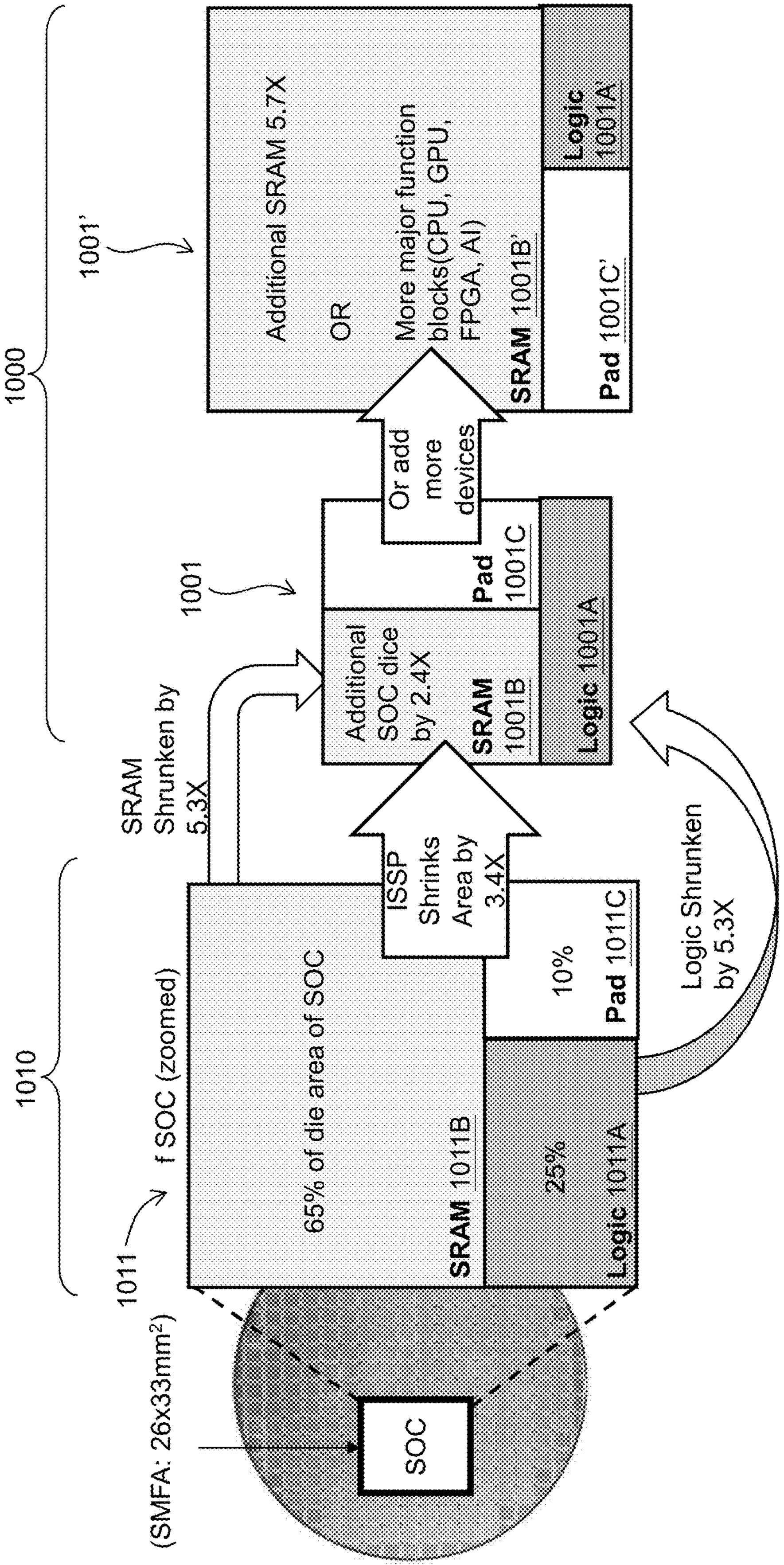
FIG. 10 is a diagram illustrating an integration system provided by an integrated scaling and stretching platform in comparison with a conventional one according to one embodiment of the present invention.
Figure 11A:
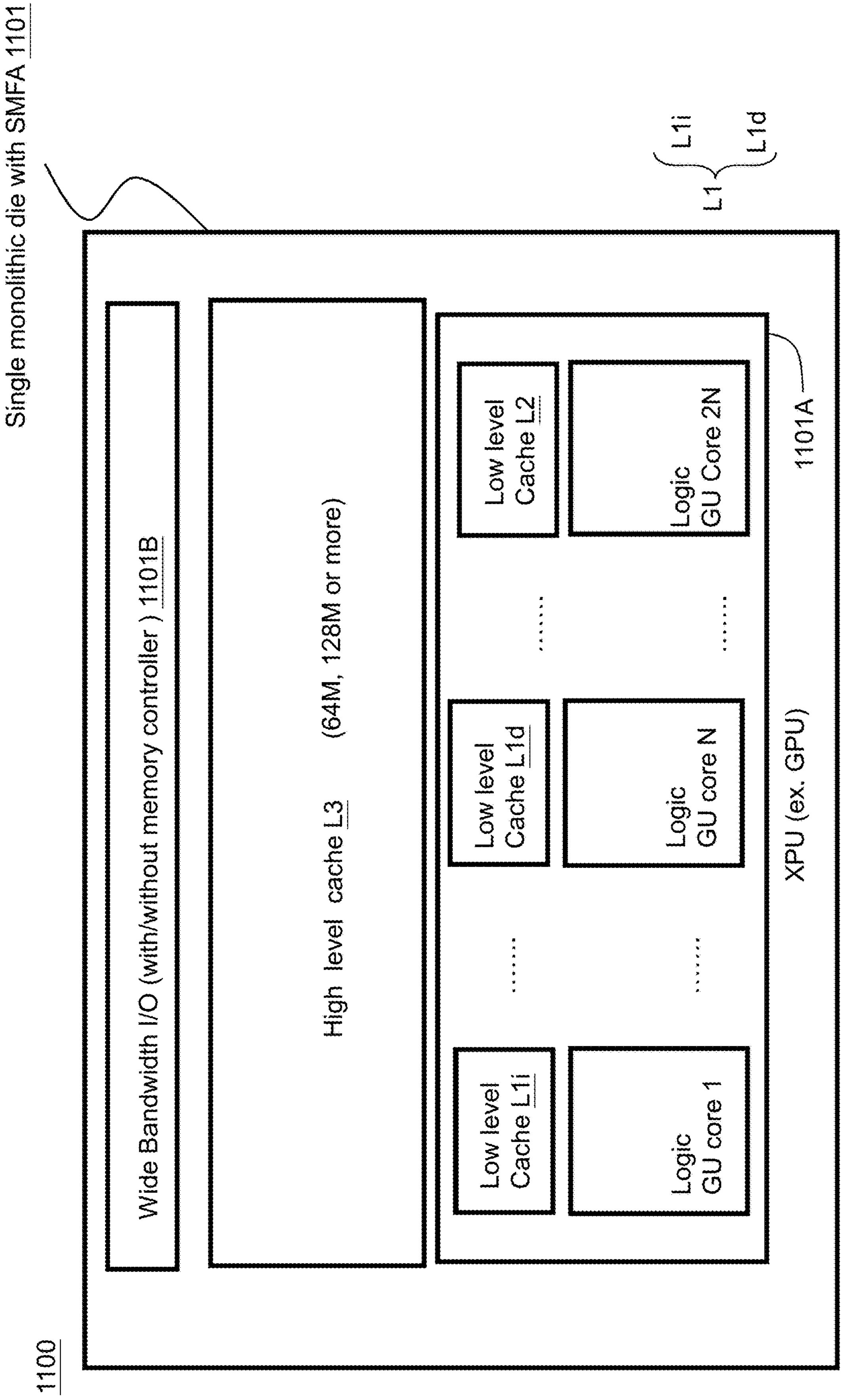
FIG. 11(*a*) is a diagram illustrating a single monolithic die of an integration system provided by the integrated scaling and stretching platform according to one embodiment of the present disclosure.
Figure 11B:
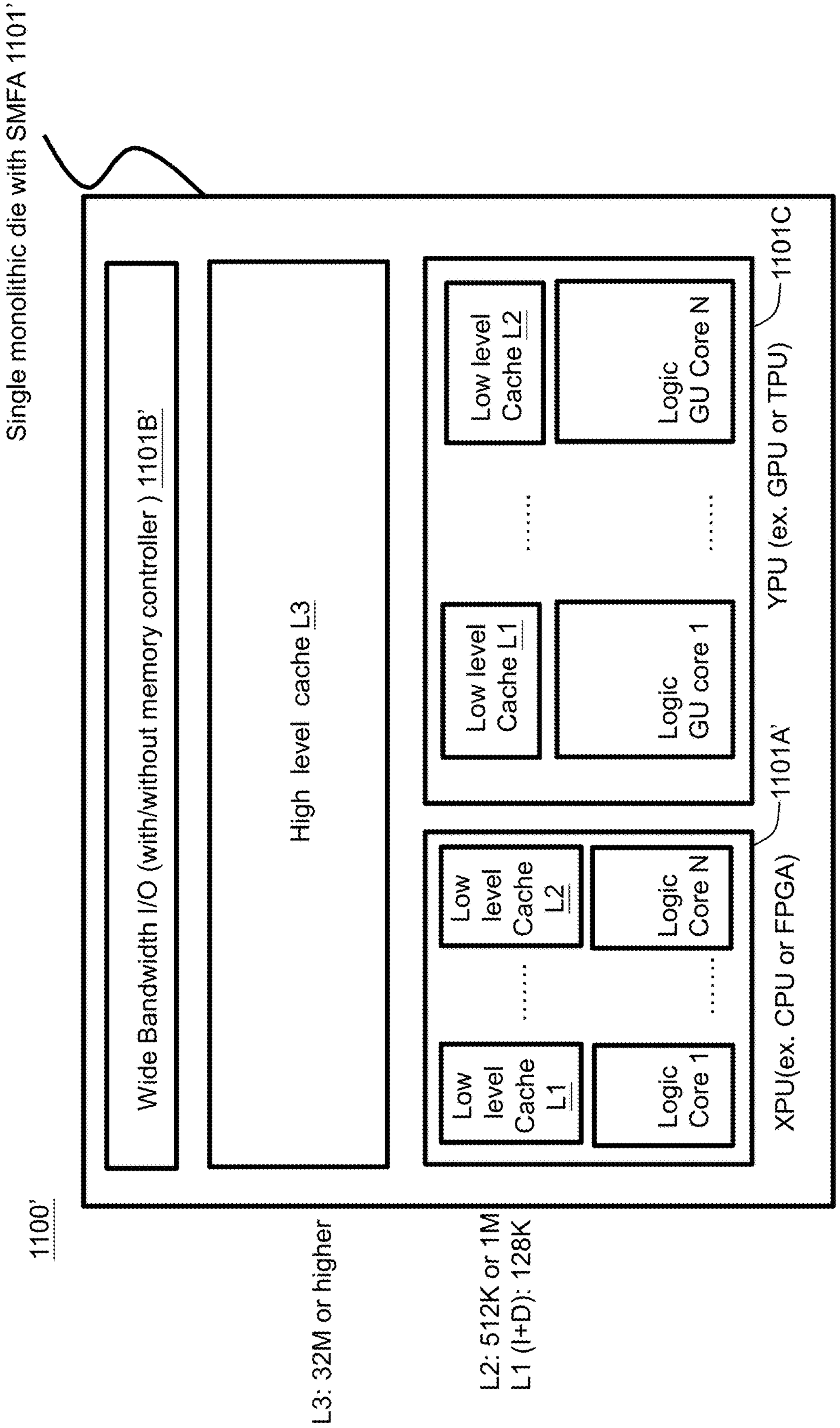
Figure 11C:
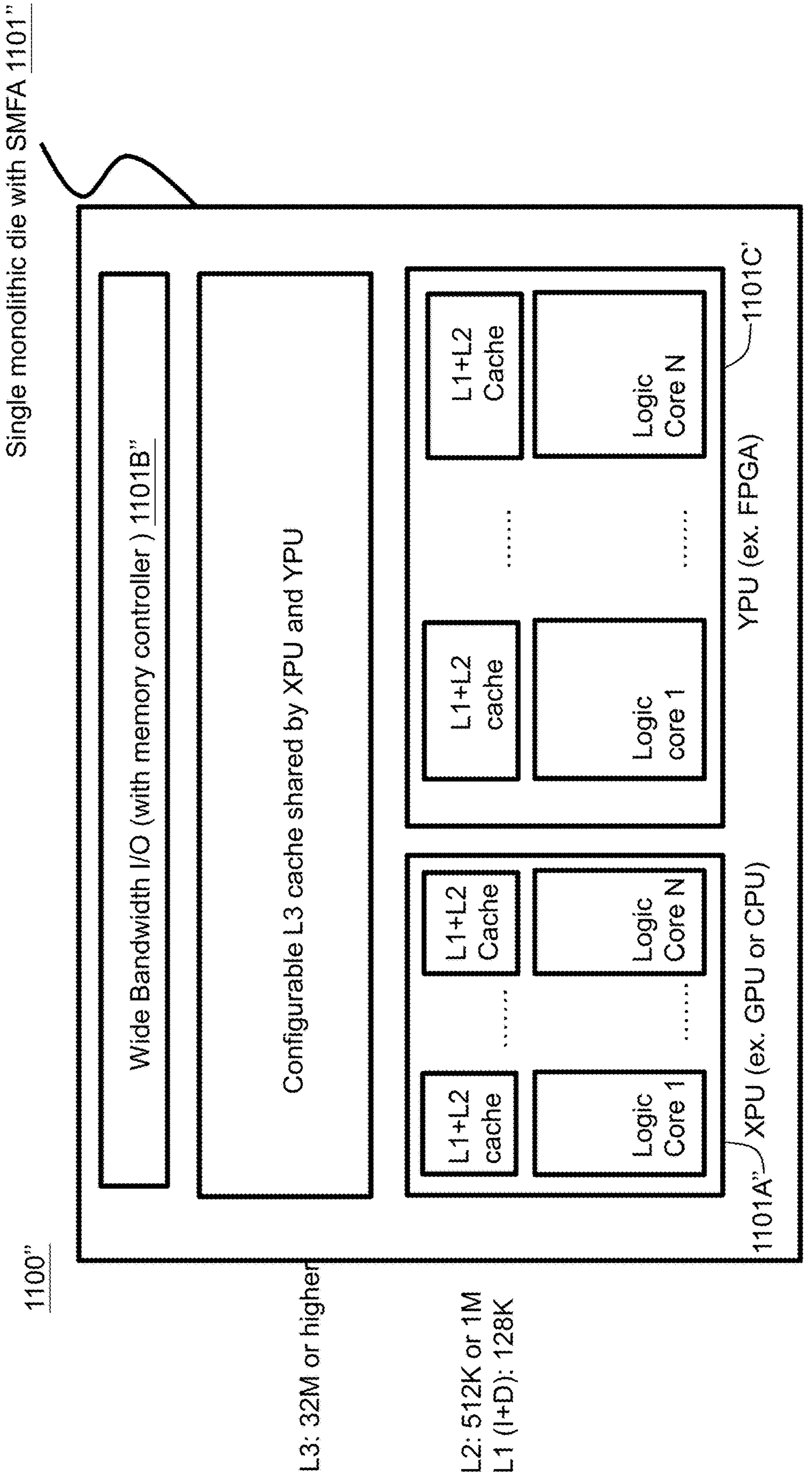
Figure 11D:
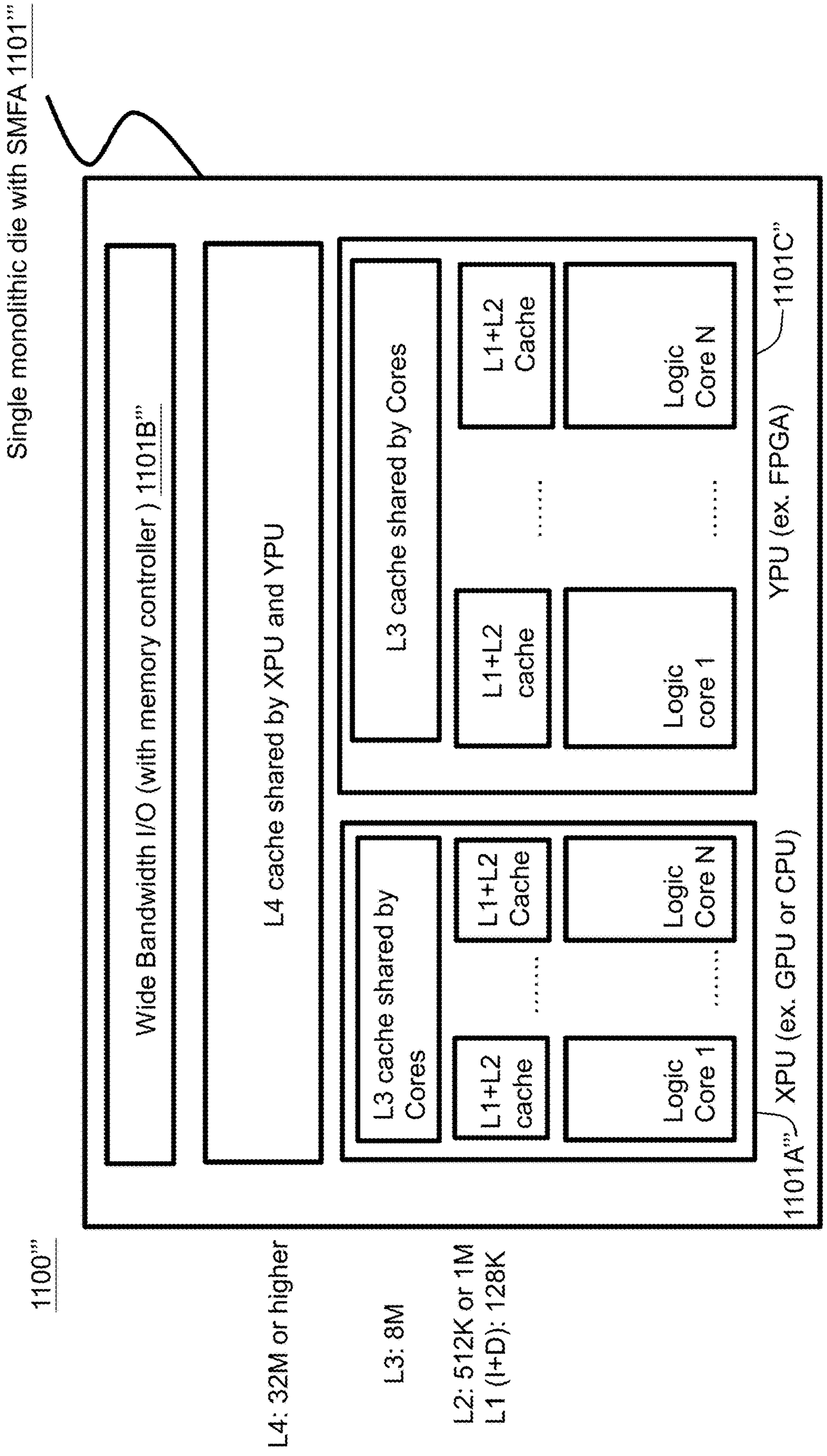

For example, FIG. 10 is a diagram illustrating an integration system 1000 based on an Integrated Scaling and Stretching Platform (ISSP) of the present invention in comparison with a conventional one. As illustrated in FIG. 10, the conventional system 1010 includes at least one single monolithic die 1011 having at least one processing units/circuit or major function blocks (such as, a logic circuit 1011A and a SRAM circuit 1011B) and a pad region 1011C; and the integration system 1000 provided by the ISSP of the present invention also includes at least one single monolithic die 1001 having a logic circuit 1001A, a SRAM circuit 1001B and a pad region 1001C. By comparing the configurations of the monolithic dies 1011 and 1001 between the conventional system 1010 and the ISSP integration system 1000, it can be indicated that the ISSP of the present invention can either shrink the size of the integration system without deteriorating the conventional performance (the monolithic die 1001), or add more device within the same scanner maximum field area (the monolithic die 1001').

In one view of shrinking the size of the ISSP integration system 1000, as shown in the middle of FIG. 10, the single monolithic die 1001 of the ISSP integration system 1000 has the same circuits or major function blocks as the conventional monolithic die 1011 (i.e., the logic circuit 1001A and the SRAM circuit 1010B of the single monolithic die 1001 are identical to the logic circuit 1011A and the SRAM circuit 1011B of the single monolithic die 1011); and the single monolithic die 1001 just occupies 20%-80% (or 30%-70%) the scanner maximum field area of the conventional monolithic die 1011.

In one embodiment, the combination area of the SRAM circuit 1001B and the logic circuit 1001A in the single monolithic die 1001 shrinks area by 3.4 times of area of the conventional monolithic die 1011. In other words, in comparison with the conventional monolithic die 1011, the ISSP of the present invention may lead the area the logic circuit 1001A of the single monolithic die 1001 shrunken by 5.3×; lead the area the SRAM circuit 1001B of the single monolithic die 1001 shrunken by 5.3×; and lead the combination area of the SRAM circuit 1001B and the logic circuit 1001A in the single monolithic die 1001 shrunken by 3.4× (as shown in the middle of FIG. 10).

In the another view of adding more devices, as shown in the right hand of FIG. 10, the single monolithic die 1001' and the conventional monolithic die 1011 have the same scanner maximum field area. That is, the single monolithic die 1001' is made based on the same technology node as that of the conventional monolithic die 1011 (such as, 5 nm or 7 nm), and the area of SRAM circuit 1001B' in the single monolithic die 1001' can not only include more SRAM cells, but can also include additional major function blocks not in the conventional monolithic die 1011. In another embodiment of the present disclosure, the die area of the single monolithic die 1001' (as shown in the right hand of FIG. 10) may be similar to or substantially the same as a scanner maximum field area (SMFA) of the conventional single monolithic die 1011 defined by a specific technology process node. That is, based on the ISSP of the present invention, in the scanner maximum field area (SMFA), there are addition space for accommodating additional SRAM cells or additional major function blocks other than that (the logic circuit 1011A and the SRAM circuit 1001B) included in the conventional monolithic die 1011.

FIG. 11(*a*) is a diagram illustrating another ISSP integration system 1100 of the present disclosure. The ISSP integration system 1100 includes at least one monolithic die 1101 with size of SMFA. The monolithic die 1101 includes processing units/circuit (such as, a XPU 1101A), SRAM caches (including high level and low level caches), and an I/O circuit 1101B. Each of the SRAM cache includes a set of SRAM arrays. The I/O circuit 1101B is electrically connected to the plurality of SRAM caches and/or the XPU 1101A.

In the present embodiment, the monolithic die 1101 of the ISSP integration system 1100 includes different level caches L1, L2 and L3 commonly made of SRAMs. Wherein the caches L1 and L2 (collectively "low level cache") are usually allocated one per CPU or GPU core unit, with the cache L1 being divided into L1i and L1d, which are used to store instructions and data respectively, and the cache L2, which does not distinguish between instructions and data; and the cache L3 (could be one of "high level cache"), which is shared by multiple cores and usually does not distinguish between instructions and data either. The cache L1/L2 is usually one per CPU or GPU core.

For high speed operation, therefore, based on the ISSP of the present disclosure, the die area of the monolithic die 1101 may be the same or substantially the same as a scanner maximum field area (SMFA) defined by a specific technology process node. However, the storage volume of the cache L1/L2 (low level cache) and the cache L3 (high level cache) of the ISSP integration system 1100 could be increased. As shown in FIG. 11(*a*), a GPU with multiple cores has a SMFA (such as 26 mm by 33 mm, or 858 $mm^2$) in which the high level cache could have 64 MB or more (such as 128 MB, 256 or 512 MB) SRAM. Furthermore, additional logic cores of the GPU could be inserted into the same SMFA to enhance the performance. So is a memory controller (not shown) within the wide bandwidth I/O 1101B, for another embodiment.

Alternatively, other than the exiting major function block, another different major function block, such as FPGA, can be integrated together in the same monolithic die. FIG. 11(*b*) is a diagram illustrating a single monolithic die 1101' of an ISSP integration system 1100' according to another embodiment of the present disclosure. In the present embodiment, the monolithic die 1101' includes at least one wide bandwidth I/O 1101B' and a plurality of processing units/circuits, such as a XPU 1101A' and a YPU 1101C. The processing units (the XPU 1101A' and the YPU 1101C) have major function blocks, and each of which could serve as a NPU, a GPU, a CPU, a FPGA, or a TPU (Tensor Processing Unit). The major function block of the XPU 1101*a*' could be different from that of the YPU 1101C.

For example, the XPU 1101A' of the ISSP integration system 1100' could serve as a CPU, and the YPU 1101C of the ISSP integration system 1100' could serve as a GPU. Each of the XPU 1101A' and the YPU 1101C has multiple logic cores, and each core has low level cache (such as cache L1/L2 with 512K or 1M/128K bits), and a high volume of high level cache (such as, cache L3 with 32 MB, 64 MB or more) shared by the XPU 1101A' and the YPU 1101C, and these three level caches may include a plurality of SRAM arrays respectively.

Due to the fact that a GPU is more and more critical for AI training, and FPGAs have blocks of logic that interact with each other and can be designed by engineers to help specific algorithms, and is suitable for AI inference. Thus, in some embodiments of the present disclosure, an ISSP integration system 1100" having a single monolithic die 1101" could include a GPU and a FPGA, as shown in FIG. 11(*c*). The configurations of the monolithic die 1101" in FIG. 11(*c*) is similar to that of the monolithic die 1101' of FIG. 11(*b*), except that the XPU 1101A" of the monolithic die 1101" is a GPU or a CPU, and the YPU 1101C' of the monolithic die 1101" is a FPGA. By this approach, the monolithic die 1101" on one hand has great parallel computing, training speed and efficiency, and on the other hand, it also owns great AI inference ability with faster time to market, lower cost, and flexibility.

In addition, as shown in FIG. 11(*c*), the processing units/circuits (i.e., the XPU 1101A" and the YPU 1101C') share the high level cache (such as, the cache L3). Wherein, the shared high level cache (such as the cache L3) between the 1101A" and the YPU 1101C' is configurable, either by setting in another mode register (not shown) or adaptively configurable during the operation of the monolithic die 1101". For example, in one embodiment, by setting the mode register, ⅓ of the high level cache could be used by the XPU 1101A", and ⅔ of the high level cache could be used by the YPU 1101C'. Such the shared volume of high level cache (such as, the cache L3) for the XPU 1101A" or the YPU 1101C' could also be dynamically changed based on the operation of the integrated scaling and/or stretching platform (ISSP) for forming the integration system 1100".

FIG. 11(*d*) is a diagram illustrating a single monolithic die 1101" of an ISSP integration system 1100" according to further another embodiment of the present disclosure. The arrangements of the monolithic die 1101" of FIG. 11(*d*) is similar to that of the monolithic die 1101' of FIG. 11(*b*), except that the high level cache includes caches L3 and caches L4, wherein each of the processing units/circuits (such as the XPU 1101A" and the YPU 1101C") has a cache L3 shared by its own cores, and the cache L4 with 32 MB or more is shared by the XPU and the YPU.

In some embodiments of the present disclosure, somewhat larger capacity shared SRAM (or embedded SRAM, "eSRAM") can be designed into one monolithic (single) die due to smaller area of SRAM cell design according to the present invention. Since high storage volume of eSRAMs can be used, it's faster and effective, as compared with the conventional embedded DRAM or the external DRAMs. Thus, it is reasonable and possible to have a high bandwidth/high storage volume SRAM within a single monolithic die which has a die size the same or substantially the same (such as 80%-99%) as scanner maximum field area (SMFA, such as 26 mm by 33 mm, or 858 $mm^2$).

Therefore, the integration system 1200 provided by the integrated scaling and/or stretching platform (ISSP) of the present disclosure could include at least two single monolithic dies, and those two monolithic dies could have the same or substantially the same size. For example, FIG. 12(*a*) is a diagram illustrating another ISSP integration system 1200 in comparison with a conventional one 1210 according to yet another embodiment of the present disclosure. The ISSP integration system 1200 includes a single monolithic die 1201 and a single monolithic die 1202 within a single package. The single monolithic die 1201 majorly has a logic processing unit circuit and low level caches formed therein; and the second monolithic die 1202 just has a plurality of SRAM arrays and I/O circuits formed therein. Wherein the plurality of SRAM arrays include at least 2~20G Bytes, such as 2G-10G Bytes.

Figure 12A:
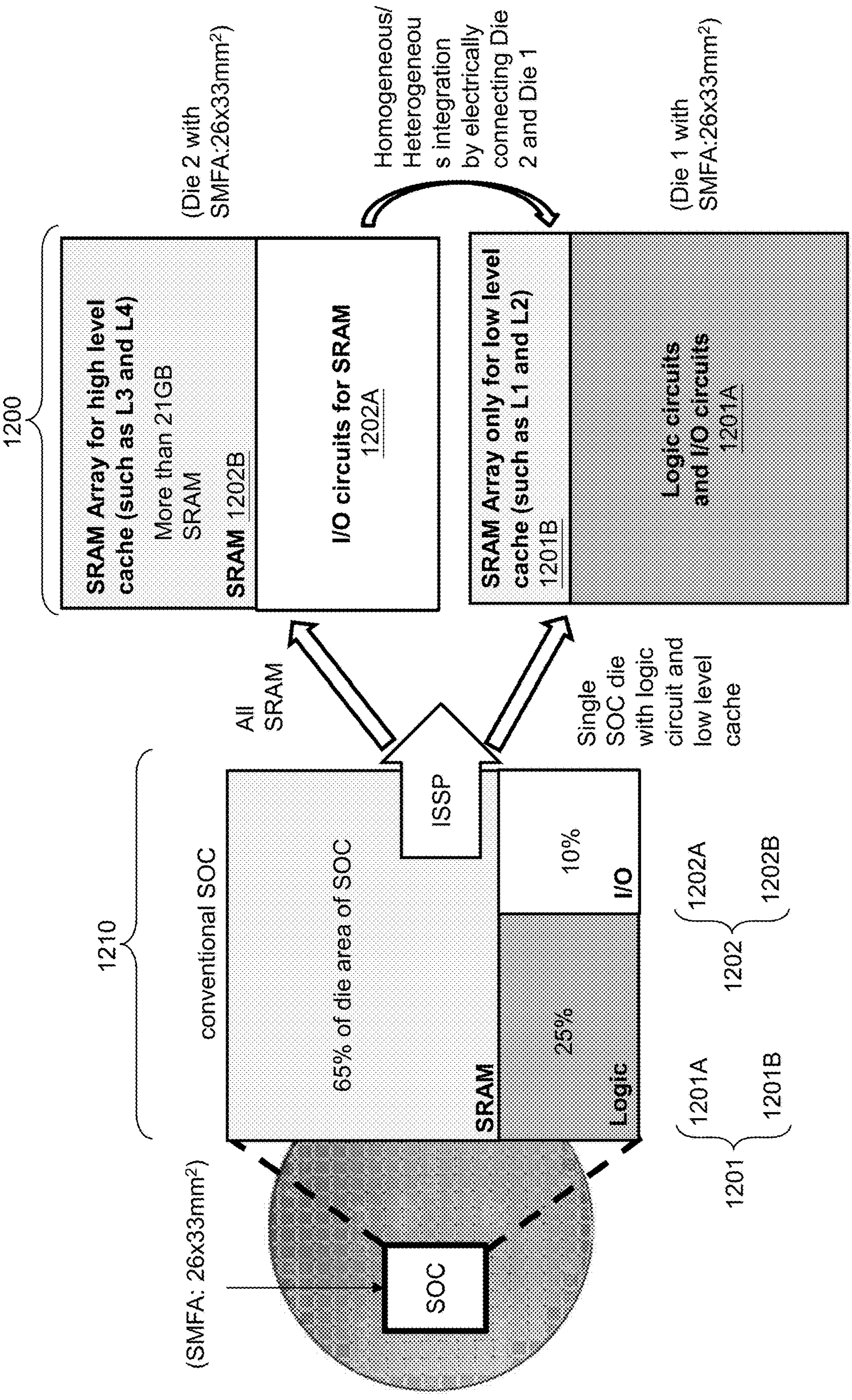
FIG. 12(*a*) is a diagram illustrating an integration system provided by the integrated scaling and stretching platform in comparison with a conventional one according to yet another embodiment of the present disclosure.
Figure 12B:
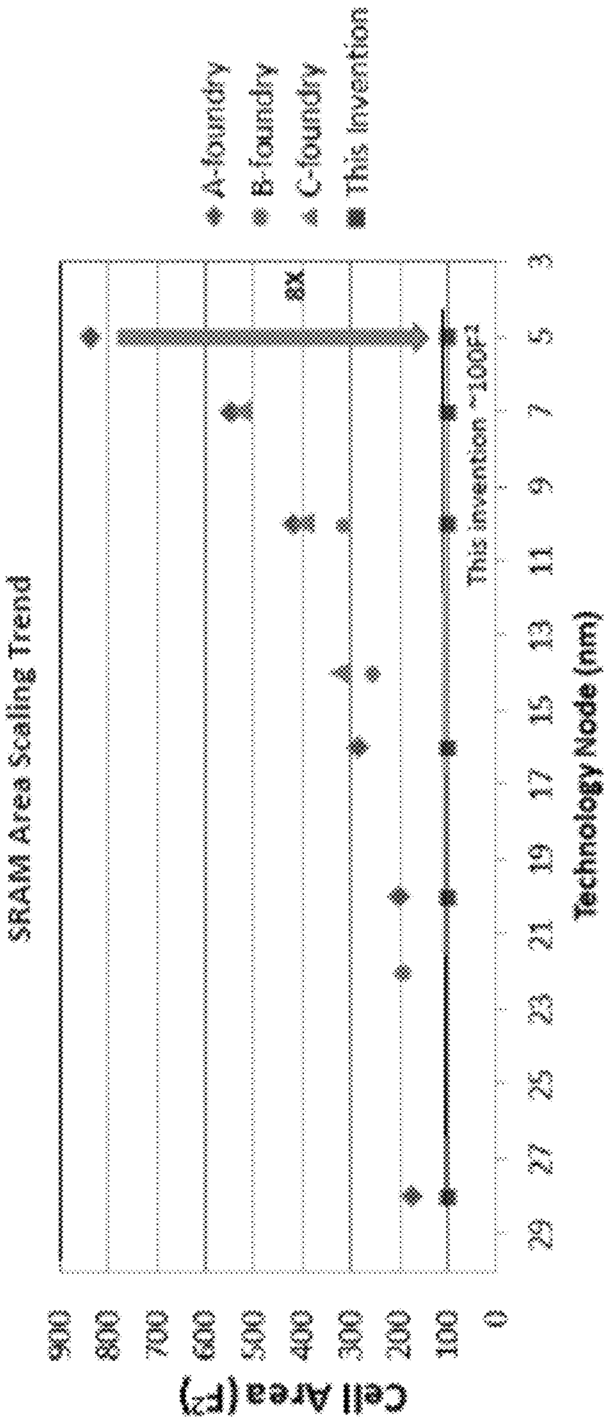

As shown in FIG. 12(*a*), the single monolithic die 1201 majorly includes a logic circuit and I/O circuit 1201A and small low level caches (such as L1 and L2 caches) made of SRAM array 1201B, and the single monolithic die 1202 just includes a high bandwidth SRAM circuit 1202B with 2~10G Bytes or more (such as 1~20G Bytes) and an I/O circuit 1202A for the high bandwidth SRAM circuit 1202B. In the present embodiment, the SMFA of the single monolithic die 1201 and the single monolithic die 1202 may be around 26 mm by 33 mm. Supposing 50% of the SMFA (50% SRAM cell utilization rate) of the single monolithic die 1202 is used for the SRAM cells of the high bandwidth SRAM circuit 1202B, and the rest of SMFA is used for the I/O circuit of the high bandwidth SRAM circuit 1202B.

FIG. 12(*b*) is a diagram illustrating the comparison results of the SRAM cell area among the integration system 1200 of the present invention and that of three foundries based on different technology nodes. The total Bytes (one bit per SRAM cell) within the SMFA of 26 mm by 33 mm of one single monolithic die (such as, the single monolithic die 1202) can be estimated by reference with the SRAM cell area as shown in FIG. 12(*b*). For example, in the present embodiment, the SMFA (26 mm by 33 mm) of the single monolithic die 1202 could accommodate 21 GB SRAM at technology node of 5 nm (the SRAM cell area is 0.0025 $\mu m^2$), and may provide 24 GB or more, in the event SRAM cell utilization rate could be increased.

According to FIG. 12(*b*), since the conventional SRAM cell area (of the three foundries) could be 2~8 times of the SRAM cell area of the present invention, thus the ISSP integration system 1200 can accommodate more Bytes (one bit per SRAM cell) than that of the prior art within the SMFA of 26 mm by 33 mm. The total Bytes (one bit per SRAM cell) within the SMFA of 26 mm by 33 mm based on different technology nodes are shown in the following Table 1:

| Technology node | 5 | 7 | 10 | 14 | 16 |
|---|---|---|---|---|---|
| SRAM cell area ($\mu m^2$) | 0.0025 | 0.0049 | 0.01 | 0.0196 | 0.0256 |
| bit/$mm^2$ | 4.00E+08 | 2.04E+08 | 1.00E+08 | 5.10E+07 | 3.9E+07 |
| 26 mm × 33 mm die (Byte) | 2.15E+10 | 1.09E+10 | 5.36E+09 | 2.74E+09 | 2.09E+09 |

Of course, in consideration of selective usage of the different technologies proposed herein and the conventional Back End of Line technology, the SMFA (26 mm by 33 mm) of the single monolithic die 1202 may accommodate smaller volume of SRAM, such as ¼~¾ times SRAM size at different technology nodes in the above table 1. For example, the single monolithic die 1202 may accommodate around 5~15 GB SRAM or 2.5 GB~7.5 GB, due to the selective usage of the different technologies proposed herein and the conventional Back End of Line technology.

Figure 13A:
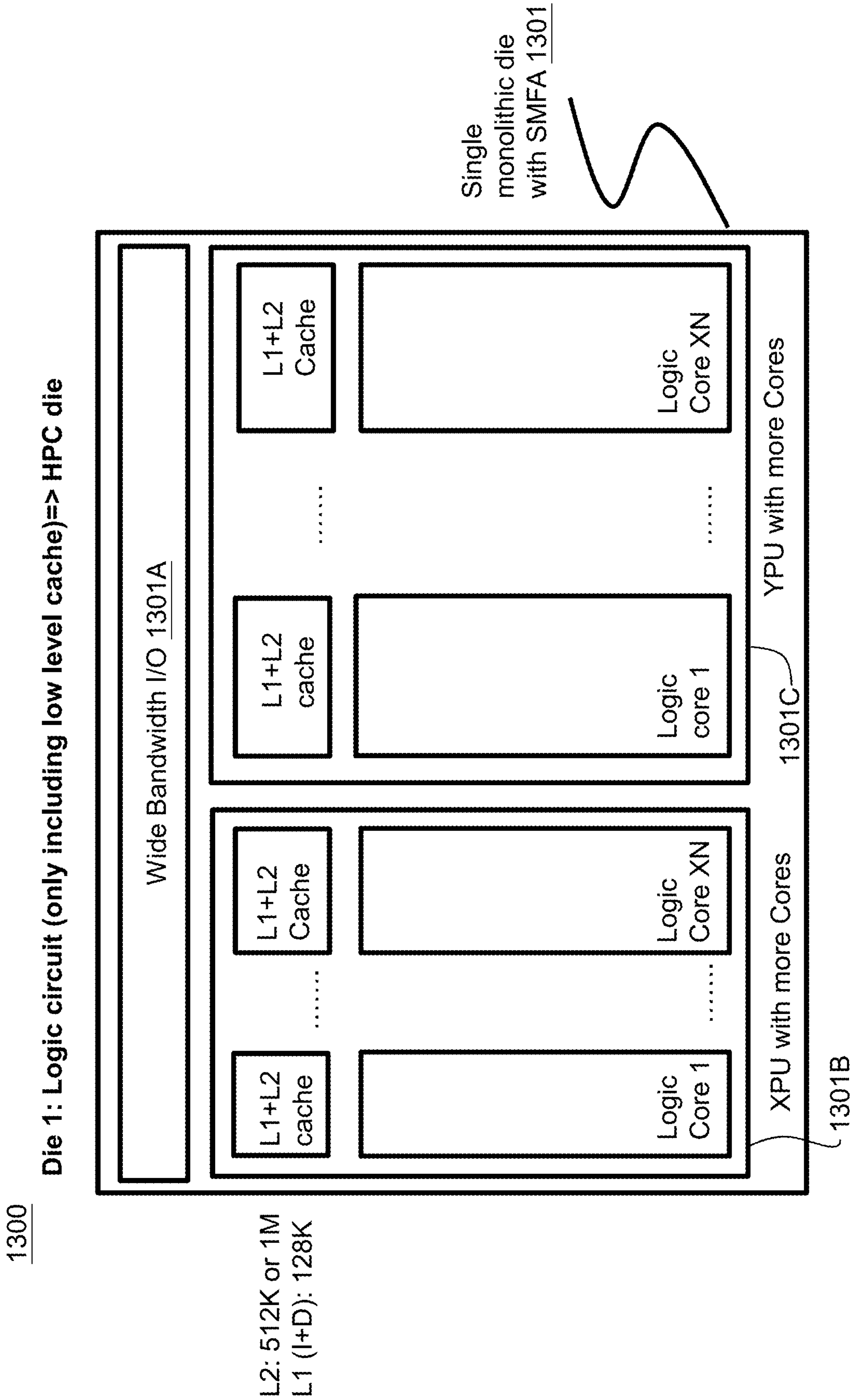
FIG. 13(*a*) is a diagram illustrating a single monolithic die of an integration system provided by the integrated scaling and stretching platform according to yet another embodiment of the present disclosure.
Figure 13B:
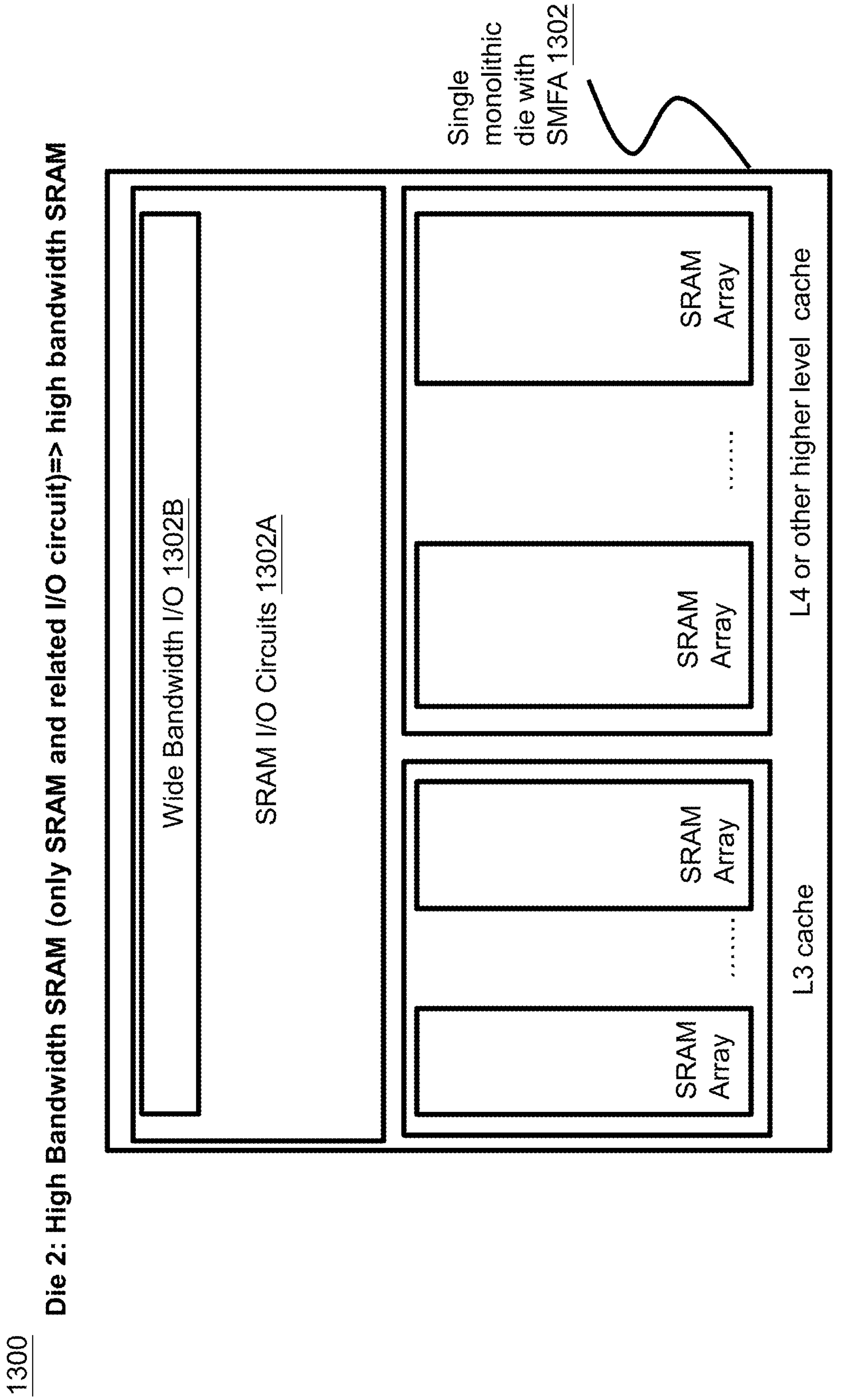

FIG. 13(*a*) is a diagram illustrating a single monolithic die 1301 of another ISSP integration system 1300 according to the present invention. The arrangements of the single monolithic die 1301 is similar to that of the single monolithic die 1201 of FIG. 12(*a*), except that the single monolithic die 1301 of the present embodiment can be a high performance computing (HPC) monolithic die that includes a wide bandwidth I/O circuit 1301A, two or more major function blocks, such as, a XPU 1301B and a YPU 1101C both with multiple cores, wherein each core of the XPU 1301B and the YPU 1301C has its own caches L1 and/or caches L2 (L1~128 KB, and L2~512 KB to 1 MB). The major function block of the XPU 1301B or the YPU 1301C in FIG. 13(*a*) could be a NPU, a GPU, a CPU, a FPGA, or a TPU (Tensor Processing Unit), each of which has major function blocks. The XPU 1301B or the YPU 1301C may have different major function blocks.

FIG. 13(*b*) is a diagram illustrating a single monolithic die 1302 of the ISSP integration system 1300. The arrangements of the single monolithic die 1302 is similar to that of the single monolithic die 1202 of FIG. 12(*a*), except that the single monolithic die 1302 is a high bandwidth SRAM (HBSRAM). In the present embodiment, the single monolithic die 1302 has a SMFA identical to (or with an area around 80-99% of) the state-of-the-art SMFA, and just includes caches L3 and/or L4 with multiple SRAM arrays, and a SRAM I/O circuits 1302A with a wide bandwidth 1302B I/O for the SRAM I/O circuits 1302A. The total SRAM in the single monolithic die 1302 could be 2~5 GB, 5~10 GB, 10~15 GB, 15~20 GB or more, depending on the utilization rate of the SRAM cells. Such single monolithic die 1302 could be a high bandwidth SRAM (HBSRAM).

Figure 14:
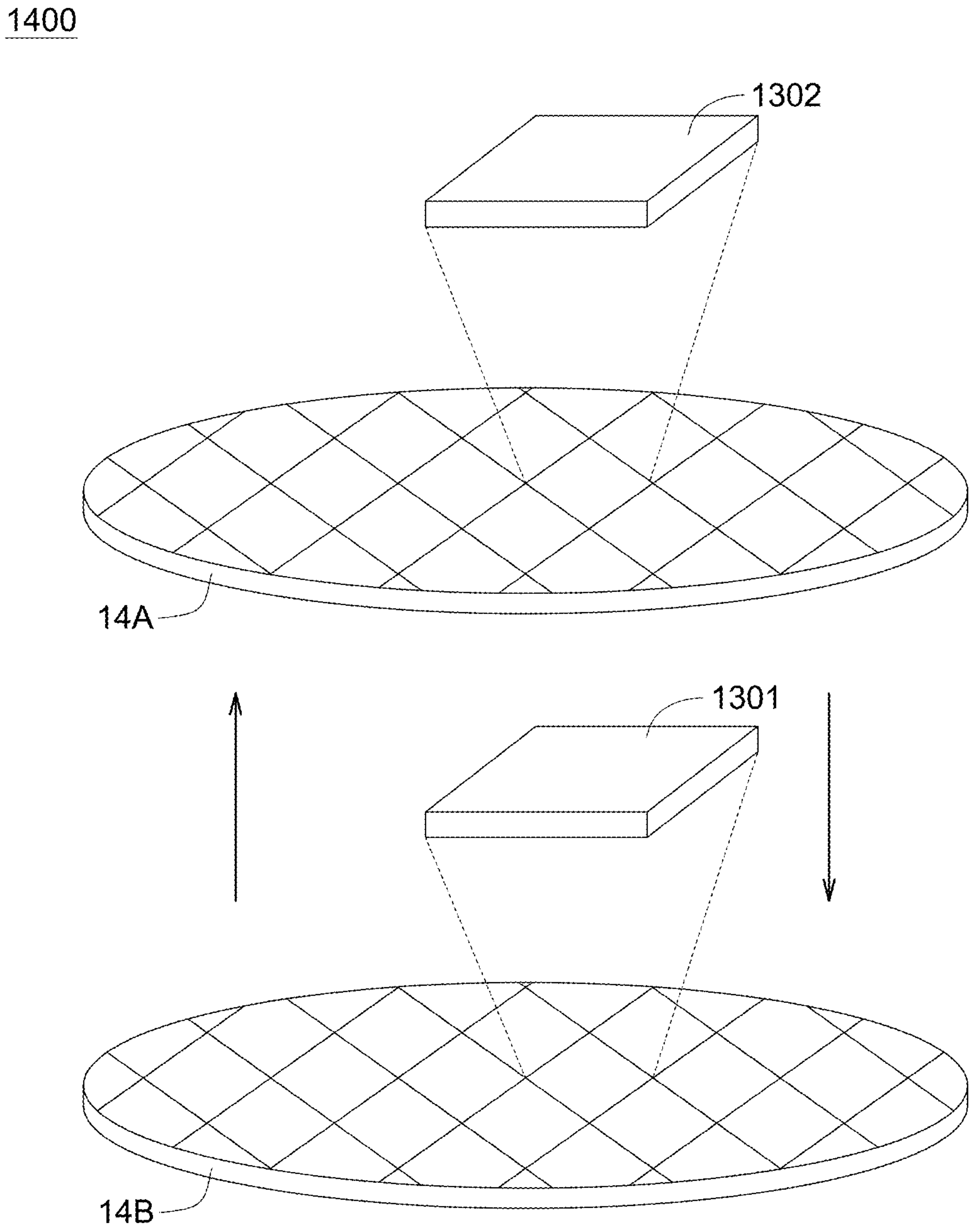
FIG. 14 is a diagram illustrating an integration system provided by the integrated scaling and stretching platform (ISSP) according to yet another embodiment of the present disclosure.

As shown in FIGS. 13(*a*) and 13(*b*), each of the single monolithic die 1301 and the single monolithic die 1302 has a wide bandwidth I/O bus, such as 64 bit, 128 bits or 256 bits data bus. The single monolithic die 1301 and the single monolithic die 1302 could be in the same IC package or in different IC package. For example, in some embodiments, the single monolithic die 1301 (such as, the HPC die) could be bonded (such as, by wire bonding, flip chip bonding, solder bonding, 2.5D interpose through silicon via (TSV) bonding, 3D micro cupper pillar direct bonding) to the single monolithic die 1302 and enclosed in a single package to form an integration system 1400, as shown in FIG. 14. In the embodiment, both the single monolithic die 1301 and the single monolithic die 1302 have the same or substantially the same SMFA, thus, such bonding could be finalized by directly bonding a wafer 14A at least having the single monolithic die 1301 (or with multiple dices) to another wafer 14B at least having the single monolithic die 1302 (or with multiple dices), and then slices the bonded wafers 14A and 14B into multiple SMFA blocks to form a the integration system 1400 provided by the ISSP of the present disclosure. It is possible that another interpose with TSV could be inserted between the single monolithic die 1301 and the single monolithic die 1302.

Figure 15:
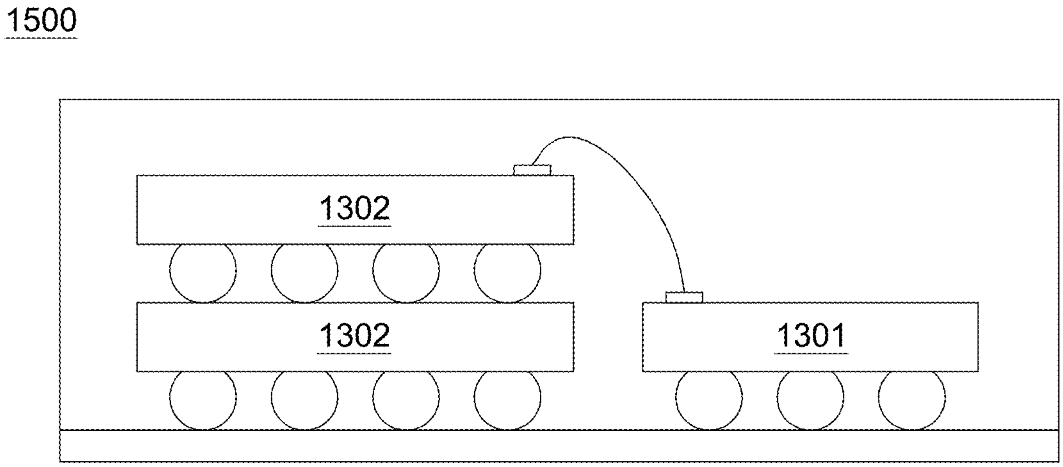
FIG. 15 is a diagram illustrating an integration system provided by the integrated scaling and stretching platform (ISSP) according to yet another embodiment of the present disclosure.

FIG. 15 is a diagram illustrating another ISSP integration system 1500 according to the present disclosure. The integration system 1500 includes two or more single monolithic die 1302 (that is two HBSRAM dies as shown in FIG. 13(*b*)) bonded together, and one of the two single monolithic die 1302 is then bonded to the single monolithic die 1301 (such as, the HPC die as shown in FIG. 13(*a*)), then all three or more dices are enclosed in a single package. Thus, such package could include a HPC die and more than 42, 48, or 96 GB HBSRAM. Of course, those two or more single monolithic die 1302 and the single monolithic die 1301 with wide bandwidth I/O bus could be vertically stacked and bonded together based on the state-of-the-art bonding technology.

Of course, it is possible three, four or more HBSRAM dices can be integrated in a single package of the integration system 1500, then the caches L3 and L4 in the integration system 1500 could be more than 128 GB or 256 GB SRAM. In some embodiments of the present disclosure, the single monolithic dies 1301 and 1302 of the integration system 1500 could be enclosed in the same IC package.

Comparing with currently available HBM DRAM memory which includes around 24 GB based on the stack of 12 DRAM chips, the present invention could replace the HBM3 memory by more HBSRAM (such as one HBSRAM chip with around 5~10 GB or 15~20 GB). Therefore, no HMB memory or only few HBM memory (such as less than 4 GB or 8 GB HBM) is required in the ISSP.

Monolithic integration on a single die which enables the success of Moore's Law is now facing its limits, especially due to limits of photography printing technologies. On one hand the minimum feature size printed on the die is very costly to be scaled in its dimension, but on the other hand the die size is limited by a Scanner Maximum Field Area. But that more and diversified functions of processors are emerging, which are hard to integrate on a monolithic die. In addition, somewhat duplicated existence of small eSRAMs on each major function die and external or embedded DRAMs are not a desirable and optimized solution. Based on the integrated scaling and/or stretching platform (ISSP) in a monolithic die or SOC die:

(1) a single major function block like FPGA, TPU, NPU, CPU or GPU can be shrunk to a much smaller size;

(2) more SRAM could be formed in the monolithic die; and (3) two or more major function block, such as GPU and FPGA (or other combination of), which has also gone through this ISSP to become smaller, can be integrated together in the same monolithic die.

(4) More levels of caches could be existed in a monolithic die.

(5) Such ISSP monolithic die could be combined with another dies (such as eDRAMs) based on heterogeneous integration.

(6) HPC Die 1 with L1&L2 caches could be electrically connected (such as wire bonding or flip chip bonding) to one or more HBSRAM Dice 2 which are utilized as L3&L4 caches in a single package, each of the HPC Die 1 and the 5 HBSRAM Die 2 has SMFA.

(7) no HMB memory or only few HBM memory is required in the ISSP.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An integration system, comprising:

a first monolithic die in which a processing unit circuit is formed; and a second monolithic die in which a plurality of SRAM arrays are formed, wherein the first monolithic die is electrically connected to the second monolithic die;

wherein the plurality of SRAM arrays or the processing unit circuit comprises a PMOS transistor and an NMOS transistor within a semiconductor substrate; the PMOS transistor has a first source region, a first drain region and a first isolation structure used to isolate a bottom of the first source region or the first drain region from the semiconductor substrate; the NMOS transistor has a second source region, a second drain region and a second isolation structure used to isolate a bottom of the second source region or the second drain region from the semiconductor substrate;

wherein the first source or the first drain region has a first lightly doped region laterally extending from a sidewall of the semiconductor substrate, a first heavily doped region laterally extending from a most lateral edge of the first lightly doped region, and a first metal region laterally connected to a most lateral edge of the first heavily doped region; or wherein the second source or the second drain region has a second lightly doped region laterally extending from a sidewall of the semiconductor substrate, a second heavily doped region laterally extending from a most lateral edge of the second lightly doped region, and a second metal region laterally connected to a most lateral edge of the first heavily doped region.

2. The integration system according to claim 1, wherein the first monolithic die has a die area the same or substantially the same as a scanner maximum field area defined by a specific technology process node, and the second monolithic die has a die area the same or substantially the same as the scanner maximum field area defined by the specific technology process node.

3. The integration system according to claim 2, wherein the scanner maximum field area is not greater than 26 mm by 33 mm, or 858 $mm^2$.

4. The integration system according to claim 2, wherein the first monolithic die and the second monolithic die are enclosed within a single package.

5. The integration system according to claim 1, wherein the plurality of SRAM arrays include between 2~20G Bytes.

6. The integration system according to claim 1, wherein the processing unit circuit comprising a first processing unit circuit and a second processing unit circuit, wherein the first processing unit circuit includes a plurality of first logic cores, and each of the plurality of first logic cores includes a first SRAM size; the second processing unit circuit includes a plurality of second logic cores, and each of the plurality of second logic cores includes a second SRAM size.

7. The integration system according to claim 6, wherein a major function performed by the first processing unit circuit is different from a major function performed by the second processing unit circuit.

8. The integration system according to claim 7, wherein the first processing unit circuit or the second processing unit circuit is selected from a group consisting of a graphic processing unit (GPU), a central processing unit (CPU), a tensor processing unit (TPU), a network processing unit (NPU) and a field programmable gate array (FPGA).

9. The integration system according to claim 1, wherein the first monolithic die further includes a L1 cache and a L2 cache utilized by the processing unit circuit during operation of the first monolithic die, and the plurality of SRAM arrays includes a L3 cache and a L4 cache utilized by the processing unit circuit during operation of the first monolithic die.

10. The integration system according to claim 1, further comprising a third monolithic die in which a plurality of SRAM arrays are formed, wherein the third monolithic die is between 2-20G Bytes, and the first monolithic die, the second monolithic die and the third monolithic die are enclosed within a single package, and wherein the first monolithic die has a die area the same or substantially the same as a scanner maximum field area defined by a specific technology process node, the second monolithic die has a die area the same or substantially the same as the scanner maximum field area defined by the specific technology process node, and the third monolithic die has a die area the same or substantially the same as the scanner maximum field area defined by the specific technology process node.

11. The integration system according to claim 10, wherein the first monolithic die, the second monolithic die and the third monolithic die are vertically stacked.

12. An integration system, comprising:

a first monolithic die with a processing unit circuit; and a second monolithic die with a plurality of SRAM arrays;

wherein the first monolithic die is physically separate from the second monolithic die, and the first monolithic die is electrically connected to the second monolithic die;

wherein the integration system includes no high bandwidth memory (HBM);

wherein the plurality of SRAM arrays or the processing unit circuit comprises a PMOS transistor and an NMOS transistor within a semiconductor substrate; the PMOS transistor has a first source region, a first drain region and a first isolation structure used to isolate a bottom of the first source region or the first drain region from the semiconductor substrate; the NMOS transistor has a second source region, a second drain region and a second isolation structure used to isolate a bottom of the second source region or the second drain region from the semiconductor substrate;

wherein the first source or the first drain region has a first lightly doped region laterally extending from a sidewall of the semiconductor substrate, a first heavily doped region laterally extending from a most lateral edge of the first lightly doped region, and a first metal region laterally connected to a most lateral edge of the first heavily doped region; or wherein the second source or the second drain region has a second lightly doped region laterally extending from a sidewall of the semiconductor substrate, a second heavily doped region laterally extending from a most lateral edge of the second lightly doped region, and a second metal region laterally connected to a most lateral edge of the first heavily doped region.

13. The integration system according to claim 12, wherein the second monolithic die has an area size the same or substantially the same as a scanner maximum field area defined by a specific technology process node, and the first monolithic die has an area size the same or substantially the same as the scanner maximum field area defined by the specific technology process node.

14. The integration system according to claim 12, the first monolithic die and the second monolithic die are enclosed within a single package, and the first monolithic chip is electrically connected to the second monolithic chip through wire bonding, flip chip bonding, solder bonding, interpose through silicon via (TSV) bonding, or micro cupper pillar direct bonding.

15. An integration system, comprising:

a substrate with an original horizontal surface;

a first monolithic circuit with a processing unit circuit; and a second monolithic circuit with a plurality of SRAM arrays, wherein the plurality of SRAM arrays are between 2-20G Bytes;

wherein the first monolithic circuit is electrically connected to the second monolithic circuit, the first monolithic circuit is formed in a first monolithic die and the second monolithic circuit is formed in a second monolithic die;

wherein the first monolithic die and the second monolithic die are enclosed in a single package, or the first monolithic die and the second monolithic die are enclosed in a first package and a second package respectively;

wherein the plurality of SRAM arrays or the processing unit circuit comprises a transistor within the substrate; the transistor comprises a source region and a drain region, and a shallow trench isolation (STI) is within the substrate and adjacent to the transistor, the STI has a top surface higher than the original horizontal surface of the substrate and surrounds the source region or the drain region;

wherein the source region or the drain region has a lightly doped region laterally extending from a sidewall of the substrate, a heavily doped region laterally extending from a most lateral edge of the lightly doped region, and a metal region laterally connected to a most lateral edge of the heavily doped region.

* * * * *